United States Patent
McNamara et al.

(10) Patent No.: US 10,236,689 B2
(45) Date of Patent: *Mar. 19, 2019

(54) METHOD AND SYSTEM FOR APPLYING ELECTRIC FIELDS TO MULTIPLE SOLAR PANELS

(71) Applicant: Solarlytics, Inc., Livermore, CA (US)

(72) Inventors: Robert P. McNamara, San Jose, CA (US); Douglas M. Raymond, Livermore, CA (US)

(73) Assignee: Solarlytics, Inc., Livermore, CA (US)

( * ) Notice: Subject to any disclaimer, the term of this patent is extended or adjusted under 35 U.S.C. 154(b) by 123 days.

This patent is subject to a terminal disclaimer.

(21) Appl. No.: 15/410,657

(22) Filed: Jan. 19, 2017

(65) Prior Publication Data
US 2017/0133856 A1 May 11, 2017

Related U.S. Application Data

(60) Division of application No. 14/637,353, filed on Mar. 3, 2015, which is a continuation-in-part of application
(Continued)

(51) Int. Cl.
*H02S 50/10* (2014.01)
*H01L 31/02* (2006.01)
(Continued)

(52) U.S. Cl.
CPC ........ *H02J 3/383* (2013.01); *H01L 31/02021* (2013.01); *H02J 7/35* (2013.01);
(Continued)

(58) Field of Classification Search
CPC ....... H02J 3/383; H02J 7/35; H01L 31/02021; H02S 50/10
(Continued)

(56) References Cited

U.S. PATENT DOCUMENTS 5,215,599 A    6/1993  Hingorani et al.
6,365,825 B1   4/2002  Hayashi et al.
(Continued)

FOREIGN PATENT DOCUMENTS

CN    1474461 A    2/2004
CN  102473764 A    5/2012
(Continued)

OTHER PUBLICATIONS

AU, Examination Report No. 1, Australian Application No. 2015218726, dated Feb. 27, 2017.
(Continued)

*Primary Examiner* — Carlos D Amaya
(74) *Attorney, Agent, or Firm* — Orrick, Herrington & Sutcliffe LLP

(57) ABSTRACT

A solar cell management system for increasing the efficiency and power output of a solar cell and methods for making and using the same. The management system provides an electric field across one or more solar cells. The imposed electric field exerts a force on both the electrons and holes created by light incident on the solar cell and accelerates the electron-hole pairs towards the electrodes of the solar cell. The solar cell management system considers variations in configuration of solar cells to maximize the power output of the solar cells. The accelerated electron-hole pairs have a lower likelihood of recombining within the cells' semiconductor's material. This reduction in the electron-hole recombination rate results in an overall increase in the solar cells' efficiency and greater power output.

73 Claims, 24 Drawing Sheets

Related U.S. Application Data

No. 14/628,079, filed on Feb. 20, 2015, now Pat. No. 10,069,306.

(60) Provisional application No. 61/943,127, filed on Feb. 21, 2014, provisional application No. 61/943,134, filed on Feb. 21, 2014, provisional application No. 61/947,326, filed on Mar. 3, 2014, provisional application No. 62/022,087, filed on Jul. 8, 2014.

(51) Int. Cl.
    *H02J 7/35*     (2006.01)
    *H02J 3/38*     (2006.01)
    *H02J 1/10*     (2006.01)

(52) U.S. Cl.
    CPC .................. *H02S 50/10* (2014.12); *H02J 1/10* (2013.01); *Y02E 10/563* (2013.01); *Y02E 10/566* (2013.01)

(58) Field of Classification Search
    USPC ........................................................ 307/116
    See application file for complete search history.

(56) References Cited

U.S. PATENT DOCUMENTS

| | | | |
|---|---|---|---|
| 7,969,757 B2 | 6/2011 | Kernahan | |
| 8,466,582 B2 | 6/2013 | Fornage | |
| 9,559,518 B2 | 1/2017 | Charkin et al. | |
| 2004/0264225 A1 | 12/2004 | Bhavaraju et al. | |
| 2009/0078304 A1* | 3/2009 | Gilmore | H01L 31/02021 136/248 |
| 2009/0160258 A1 | 6/2009 | Allen et al. | |
| 2010/0275968 A1* | 11/2010 | Kaiser | H01L 31/02021 136/244 |
| 2012/0006408 A1 | 1/2012 | El-Ghoroury et al. | |
| 2012/0205974 A1 | 8/2012 | McCaslin et al. | |
| 2013/0125950 A1 | 5/2013 | Zingher | |
| 2013/0306140 A1 | 11/2013 | Edmonson et al. | |
| 2015/0107644 A1 | 4/2015 | Kumar | |

FOREIGN PATENT DOCUMENTS

| | | |
|---|---|---|
| CN | 103097974 A | 5/2013 |
| CN | 103098222 A | 5/2013 |
| DE | 20 2012 011176 U1 | 5/2013 |
| GB | 2498448 A | 7/2013 |
| JP | H07-337049 A | 12/1995 |
| JP | H10-173215 A | 6/1998 |
| JP | 2016-509068 A | 3/2017 |
| KR | 10-2009-0128954 A | 12/2009 |
| KR | 10-2013-0100981 A | 9/2013 |
| KR | 10-2014-0008531 A | 1/2014 |
| WO | WO 2006/078685 A2 | 7/2006 |
| WO | WO 2008/125915 A2 | 10/2008 |
| WO | WO 2010/070621 A1 | 6/2010 |
| WO | WO 2012/162268 A2 | 11/2012 |
| WO | WO 2015/057913 A2 | 4/2015 |

OTHER PUBLICATIONS

AU, Examination Report No. 1, Australian Application No. 2015227260, dated Mar. 9, 2017.
CA, Examiner Report, Canadian Appiication No. 2,939,004 dated Mar. 15, 2017.
EP, Search Report, European Application No. 16189399.5, dated Feb. 14, 2017.
EP, Search Report, European Application No. 16189404.3, dated Mar. 2, 2017.
KR, Office Action, Korean Application No. 10-2016-7027166, dated Mar. 9, 2017.
KR, Office Action, Korean Application No. 10-2017-7005180, dated Mar. 9, 2017.
NZ, First Examination Report, New Zealand Application No. 722832, dated Dec. 16, 2016.
NZ, First Examination Report, New Zealand Application No. 721992, dated Feb. 13, 2017.
WO, International Search Report & Written Opinion, Application No. PCT/US2015/016981, dated Jun. 26, 2016.
WO, International Search Report & Written Opinion, Application No. PCT/US2015/018552, dated Jun. 29, 2015.
EP, Communication pursuant to Article 94(3) EPC, European Patent Application No. 15 710 361.5, dated May 17, 2017.
KR, Notification of Provisional Rejection, Korean Patent Application No. 10-2017-7005174, dated May 26, 2017.
CN, Notification of the First Office Action, Chinese Application No. 201580012041.5, dated Jun. 8, 2017.
CA, Examiner's Report, Canadian Application No. 2,937,025, dated Jul. 11, 2017.
CA, Examiner's Report, Canadian Application No. 2,939,004, dated Jul. 21, 2017.
U.S. Office Action, U.S. Appl. No. 14/628,079, dated Aug. 18, 2017.
NZ, Further Examination Report, New Zealand Application No. 721992, dated Aug. 18, 2017.
KR, Notice of First Refusal, Korean Patent Application No. 10-2017-7005180, dated Aug. 21, 2017.
SG, Written Opinion, Patent Application No. 11201607087S, dated Aug. 24, 2017.
JP, Notice of Grounds for Rejection, Patent Application No. 2017-043629, dated Sep. 19, 2017.
CN, Second Office Action, Application No. 201580012041.5, dated Sep. 21, 2017.
EP, Communication pursuant to Article 94(3) EPC, Application No. 16 189 399.5, dated Oct. 5, 2017.
EA, Conclusion on patentability of an invention, Application No. 201691604/31, dated Oct. 6, 2017.
U.S. Office Action, U.S. Appl. No. 15/410,637, dated Nov. 3, 2017.
SunPower, "SunPower Discovers the 'Surface Polarization' Effect in High Efficiency Solar Cells," Aug. 2005.
CL, Expert Examiner Report, Patent Application No. 201602108, dated Nov. 16, 2017.
CL, Expert Examiner Report, Patent Application No. 201602210, dated Nov. 16, 2017.
NZ, Further Examination Report, Patent Application No. 721992, dated Dec. 8, 2017.
EP, Communication pursuant to Article 94(3) EPC, Patent Application No. 16 189 404.3, dated Dec. 11, 2017.
KR, Notification of Provisional Rejection, Patent Application No. 10-2017-7033565, dated Jan. 5, 2018.
EA, Notification, Patent Application No. 201691635/31, dated Jan. 24, 2018.
CN, Third Office Action, Application No. 201580012041.5, dated Jan. 26, 2018.
EP, Communication pursuant to Article 94(3) EPC, Application No. 16 189 399.5, dated Feb. 16, 2018.
EA, Notification, Patent Application No. 201691604/31, dated Feb. 15, 2018.
JP, Notice of Grounds for Rejection, Patent Application No. 2017-043626, dated Feb. 20, 2018.
EP, Communication pursuant to Article 94(3) EPC, Application No. 17 192 984.7, dated Mar. 5, 2018.
EP, Communication pursuant to Article 94(3) EPC, Application No. 17 192 983.9, dated Mar. 6, 2018.
EP, Communication pursuant to Article 94(3) EPC, Application No. 16 189 404.3, dated Apr. 10, 2018.
Lazić, P., et al., "Low intensity conduction states in $FeS_2$: implications for absorption, open-circuit voltage and surface recombination", Journal of Physics: Condensed Matter, 25 (2013) 465801, pp. 1-10, Nov. 25, 2013.
Paraskeva, Vasiliki, et al., "Voltage and light bias dependent quantum efficiency measurements of GaInP/GaInAs/Ge triple junction device", Solar Energy Materials & Solar Cells, 116 (2013), pp. 55-60, May 8, 2013.

(56) References Cited

OTHER PUBLICATIONS

EP, Extended European Search Report, Application No. 17 20 4510.6, dated Mar. 20, 2018.
EP, Extended European Search Report, Application No. 17 20 4517.1, dated Mar. 21, 2018.
KR, Notification of Reason for Refusal, Application No. 10-2018-7007815, dated Mar. 29, 2018.
PH, Substantive Examination Report, Application No. 1-2016-501643, dated Apr. 26, 2018.
KR, Notification of Reason for Refusal, Application No. 10-2018-7007818, dated May 4, 2018.
EA, Patent Search Report, Application No. 201792352, dated May 11, 2018.
JP, Notice of Grounds for Rejection, Japanese Patent Application No. 2016-553379, dated Mar. 21, 2017.
JP, Notice of Grounds for Rejection, Japanese Patent Application No. 2016-555354, dated Mar. 21, 2017.
AU, Examination Report No. 2, Australian Patent Application No. 2015227260, dated May 1, 2017.
EP, Communication pursuant to Article 94(3) EPC, European Patent Application No. 16 189 399.5, dated May 9, 2017.
AU, Examination Report No. 2, Australian Patent Application No. 2015218726, dated May 14, 2017.
EP, Communication pursuant to Article 94(3) EPC, Application No. 17 204 510.6, dated Sep. 28, 2018.
EP, Communication pursuant to Article 94(3) EPC, Application No. 17 192 984.7, dated Sep. 28, 2018.
CN, First Office Action, Application No. 201710141110.3, dated Jun. 21, 2018.
CN, First Office Action, Application No. 201710201991.3, dated Aug. 2, 2018.
JP, Notice of Grounds for Rejection, Patent Application No. 2017-043626, dated Jun. 19, 2018.

* cited by examiner

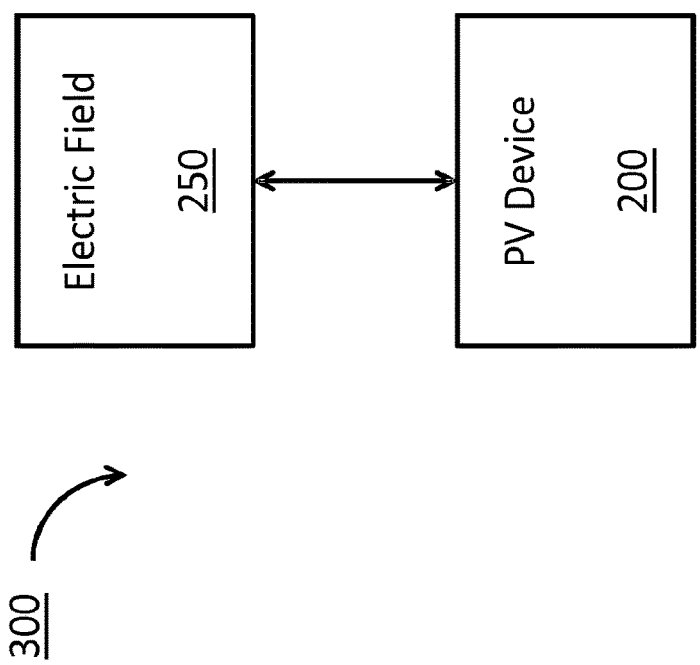

METHOD AND SYSTEM FOR APPLYING ELECTRIC FIELDS TO MULTIPLE SOLAR PANELS

CROSS-REFERENCE TO RELATED APPLICATIONS

This application is a divisional application of co-pending U.S. patent application Ser. No. 14/637,353, filed on Mar. 3, 2015, which is a continuation-in-part of and claims the benefit of U.S. patent application Ser. No. 14/628,079, filed Feb. 20, 2015, which claims the benefit of U.S. Provisional Application No. 61/943,127, filed Feb. 21, 2014; U.S. Provisional Application No. 61/943,134, filed Feb. 21, 2014; U.S. Provisional Application No. 61/947,326, filed Mar. 3, 2014; and U.S. Provisional Application No. 62/022,087, filed Jul. 8, 2014, the disclosures of which are hereby incorporated by reference in their entireties and for all purposes.

FIELD

The present disclosure relates generally to photovoltaic devices and more specifically, but not exclusively, to systems and methods for maximizing the power or energy generated and the overall efficiency of one or more solar cells, for example, by applying and adjusting an external electric field across the solar cells.

BACKGROUND

A solar cell (also called a photovoltaic cell) is an electrical device that converts the energy of light directly into electricity by a process known as "the photovoltaic effect." When exposed to light, the solar cell can generate and support an electric current without being attached to any external voltage source.

The most common solar cell consists of a p-n junction 110 fabricated from semiconductor materials (e.g., silicon), such as in a solar cell 100 shown in FIG. 1. For example, the p-n junction 110 includes a thin wafer consisting of an ultra-thin layer of n-type silicon on top of a thicker layer of p-type silicon. Where these two layers are in contact, an electrical field (not shown) is created near the top surface of the solar cell 100, and a diffusion of electrons occurs from the region of high electron concentration (the n-type side of the p-n junction 110) into the region of low electron concentration (the p-type side of the p-n junction 110).

The p-n junction 110 is encapsulated between two conductive electrodes 101a, 101b. The top electrode 101a is either transparent to incident (solar) radiation or does not entirely cover the top of the solar cell 100. The electrodes 101a, 101b can serve as ohmic metal-semiconductor contacts that are connected to an external load 30 that is coupled in series. Although shown as resistive only, the load 30 can also include both resistive and reactive components.

When a photon hits the solar cell 100, the photon either: passes straight through the solar cell material—which generally happens for lower energy photons; reflects off the surface of the solar cell; or preferably is absorbed by the solar cell material—if the photon energy is higher than the silicon band gap—generating an electron-hole pair.

If the photon is absorbed, its energy is given to an electron in the solar cell material. Usually this electron is in the valence band and is tightly bound in covalent bonds between neighboring atoms, and hence unable to move far. The energy given to the electron by the photon "excites" the electron into the conduction band, where it is free to move around within the solar cell 100. The covalent bond that the electron was previously a part of now has one fewer electron—this is known as a hole. The presence of a missing covalent bond allows the bonded electrons of neighboring atoms to move into the hole, leaving another hole behind. In this way, a hole also can move effectively through the solar cell 100. Thus, photons absorbed in the solar cell 100 create mobile electron-hole pairs.

The mobile electron—hole pair diffuses or drifts toward the electrodes 101a, 101b. Typically, the electron diffuses/drifts towards the negative electrode, and the hole diffuses/drifts towards the positive electrode. Diffusion of carriers (e.g., electrons) is due to random thermal motion until the carrier is captured by electrical fields. Drifting of carriers is driven by electric fields established across an active field of the solar cell 100. In thin film solar cells, the dominant mode of charge carrier separation is drifting, driven by the electrostatic field of the p-n junction 110 extending throughout the thickness of the thin film solar cell. However, for thicker solar cells having virtually no electric field in the active region, the dominant mode of charge carrier separation is diffusion. The diffusion length of minor carriers (i.e., the length that photo-generated carriers can travel before they recombine) must be large in thicker solar cells.

Ultimately, electrons that are created on the n-type side of the p-n junction 110, "collected" by the p-n junction 110, and swept onto the n-type side can provide power to the external load 30 (via the electrode 101a) and return to the p-type side (via the electrode 101b) of the solar cell 100. Once returning to the p-type side, the electron can recombine with a hole that was either created as an electron-hole pair on the p-type side or swept across the p-n junction 110 from the n-type side.

As shown in FIG. 1, the electron-hole pair travels a circuitous route from the point the electron-hole pair is created to the point where the electron-hole pair is collected at the electrodes 101a, 101b. Since the path traveled by the electron-hole pair is long, ample opportunity exists for the electron or hole to recombine with another hole or electron, which recombination results in a loss of current to any external load 30. Stated in another way, when an electron-hole pair is created, one of the carriers may reach the p-n junction 110 (a collected carrier) and contribute to the current produced by the solar cell 100. Alternatively, the carrier can recombine with no net contribution to cell current. Charge recombination causes a drop in quantum efficiency (i.e., the percentage of photons that are converted to electric current when the solar cell 100), and, therefore, the overall efficiency of the solar cell 100.

Recent attempts to reduce the cost and increase the efficiency of solar cells include testing various materials and different fabrication techniques used for the solar cells. Another approach attempts to enhance the depletion region formed around the p-n junction 110 for enhancing the movement of charge carriers through the solar cell 100. For example, see U.S. Pat. No. 5,215,599, to Hingorani, et al. ("Hingorani"), filed on May 3, 1991, and U.S. Pat. No. 8,466,582, to Fornage ("Fornage"), filed on Dec. 2, 2011, claiming priority to a Dec. 3, 2010 filing date, the disclosures of which are hereby incorporated by reference in their entireties and for all purposes.

However, these conventional approaches for enhancing the movement of charge carriers through the solar cell 100 require a modification of the fundamental structure of the solar cell 100. Hingorani and Fornage, for example, disclose applying an external electric field to the solar cell using a modified solar cell structure. The application of the external electric field requires a voltage to be applied between electrodes inducing the electric field (described in further detail with reference to equation 2, below). Without modifying the fundamental structure of the solar cell 100, applying the voltage to the existing electrodes 101a, 101b of the solar cell 100 shorts the applied voltage through the external load 30. Stated in another way, applying voltage to the electrodes 101a, 101b of the solar 100 is ineffective for creating an external electric field and enhancing the movement of charge carriers. Accordingly, conventional approaches—such as disclosed in Hingoriani and Fornage—necessarily modify the fundamental structure of the solar cell 100, such as by inserting an external (and electrically isolated) set of electrodes on the base of the solar cell 100. There are several disadvantages with this approach.

For example, the external electrodes must be placed on the solar cell 100 during the fabrication process—it is virtually impossible to retrofit the external electrodes to an existing solar cell or panel. This modification to the fabrication process significantly increases the cost of manufacturing and decreases the manufacturing yield. Additionally, placement of the external electrodes over the front, or incident side, of the solar cell 100 reduces the optical energy which reaches the solar cell 100, thereby yielding a lower power output.

As a further disadvantage, to yield significant improvements in power output of the solar cell 100, sizeable voltages must be applied to the external electrodes of the solar cell 100. For example, Fornage discloses that voltages on the order of "1,000's" of volts must be placed on the external electrodes for the applied electric field to be effective and increase the power output of the solar cell 100. The magnitude of this voltage requires special training for servicing as well as additional high voltage equipment and wiring that does not presently exist in existing or new solar panel deployments. As an example, an insulation layer between the external electrodes and the solar cell 100 must be sufficient to withstand the high applied voltage. In the event of a failure of the insulation layer, there is a significant risk of damage to not only the solar cell 100, but also all solar cells 100 connected in series or parallel to the failed solar cell as well as the external load 30.

As a further disadvantage, typical installation of the solar cell 100 can introduce additional factors—such as additional wiring, external hardware, and so on—that can affect the power output of the solar cell 100. For example, multiple solar cells 100 can be coupled (in series and/or parallel) together to form a solar panel 10 (shown in FIGS. 2A-D). Each solar panel 10 can then be coupled using any suitable means described herein, including in parallel, series, or a combination thereof. With reference to FIGS. 2A-D, typical installation configurations using at least one solar panel 10 are shown.

The solar panels 10 can be connected in either parallel (FIG. 2A), series (FIG. 2B), or a combination thereof (FIG. 2C). In each of FIGS. 2A-C, the solar panels 10 can drive a load, such as an inverter 31. FIG. 2A shows a series coupling of the solar panels 10. Turning to FIG. 2B, the solar panels 10 are shown connected in series and drives the inverter 31. FIG. 2C shows an alternative installation of the solar panels 10 connected both in parallel and in series. In yet another embodiment, FIG. 2D shows an installation—typically found in many residential installations—where each of the solar panels 10 are connected to its own inverter 31.

Each method of connecting the solar cells 100 and the solar panels 10 requires different wiring and installation methods that change the electrical characteristics/behavior, and the corresponding power output, of the connected solar panels 10. Conventional efforts to increase the efficiency of solar cells rarely account for installation obstacles, such as the various methods for connecting multiple solar cells 100 and/or multiple solar panels 10.

In view of the foregoing, a need exists for an improved solar cell system and method for increased efficiency and power output, such as with increased mobility of electron-hole pairs, in an effort to overcome the aforementioned obstacles and deficiencies of conventional solar cell systems.

BRIEF DESCRIPTION OF THE DRAWINGS

FIG. 3 is an exemplary top-level block diagram illustrating an embodiment of a solar cell management system.

Figure 1:
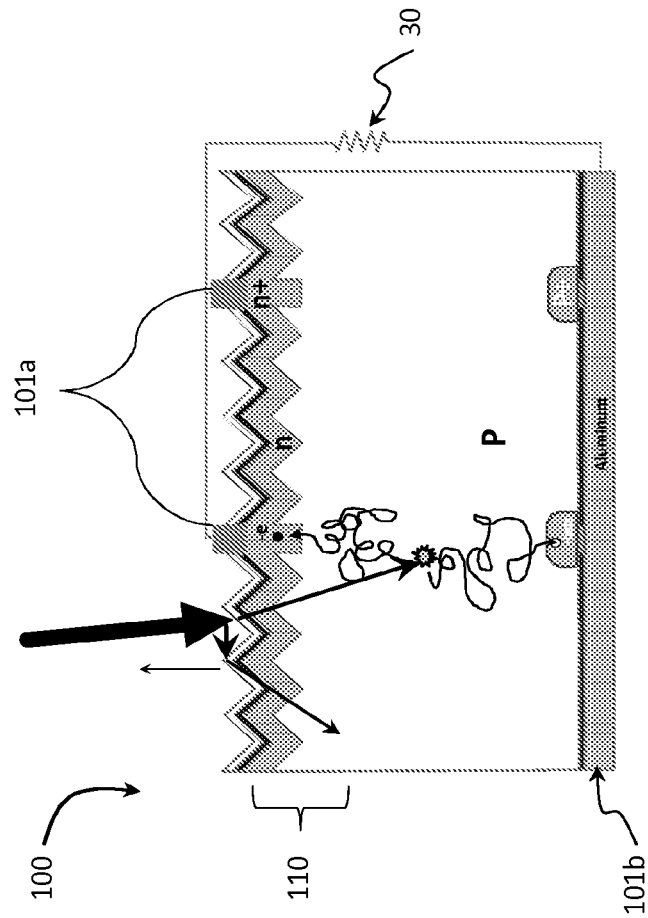
FIG. 1 is an exemplary top-level cross-sectional diagram illustrating an embodiment of a solar cell of the prior art.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

DETAILED DESCRIPTION OF THE PREFERRED EMBODIMENTS

Since currently-available solar cell systems fail to maximize the power output of a photovoltaic cell, a solar cell system that increases the mobility of electron-hole pairs and reduces the recombination current in a semiconductor material can prove desirable and provide a basis for a wide range of solar cell systems, such as to increase the efficiency and power output of solar cells configured as a solar panel. This result can be achieved, according to one embodiment disclosed herein, by a solar cell management system 300 as illustrated in FIG. 3.

Turning to FIG. 3, the solar cell management system 300 is suitable for use with a wide range of photovoltaic devices. In one embodiment, the solar cell management system 300 can be suitable for use with the solar cell 100 shown in FIG. 1. For example, the solar cell 100 can represent any suitable generation of solar cells such as wafer-based cells of crystalline silicon (first generation), thin film solar cells including amorphous silicon cells (second generation), and/or third generation cells. The solar cell management system 300 advantageously can be used with any generation of solar cell 100 without structural modification—and the associated drawbacks.

In another embodiment, the solar cell management system 300 can be suitable for use with multiple solar cells 100, such as the solar panels 10 shown in FIGS. 2A-D. As previously discussed, multiple solar cells 100 can be coupled (in series and/or parallel) together to form a solar panel 10. The solar panels 10 can be mounted on a supporting structure (not shown) via ground mounting, roof mounting, solar tracking systems, fixed racks, and so on and can be utilized for both terrestrial and space borne applications. Similarly, the solar cell management system 300 advantageously can be used with any generation of solar panel 10 without structural modification—and the associated drawbacks—of the solar panel 10.

As shown in FIG. 3, the photovoltaic device 200 cooperates with an electric field 250. In some embodiments, the polarity of the electric field 250 can be applied in either the same direction or the reverse direction as the polarity of the electrodes 101a, 101b (shown in FIG. 1) in the photovoltaic device 200. For example, if applying the electric field 250 in the same direction as the polarity of the electrodes 101a, 101b in the photovoltaic device 200, the electric field 250 acts on the electron-hole pairs in the photovoltaic device 200 to impose a force—$e^-E$ or $h^+E$ on the electron or hole, respectively—thereby accelerating the mobility of the electron and hole towards respective electrodes. Alternatively, if the polarity of the electric field 250 is reversed, the mobility of the electron-hole pairs in the photovoltaic device 200 decreases, thereby increasing the recombination current within the photovoltaic device 200. Accordingly, the efficiency of the photovoltaic device 200 can be diminished as desired, such as for managing the power output of the photovoltaic device 200.

Furthermore, the electric field 250 applied to the photovoltaic device 200 can be static or time varying as desired. In the case where the electric field 250 is time varying, the electric field 250 has a time averaged magnitude that is non-zero. Stated in another way, the net force on the electrons and holes is non-zero to provide increased mobility in the electron-hole pairs of the photovoltaic device 200.

Figure 4:
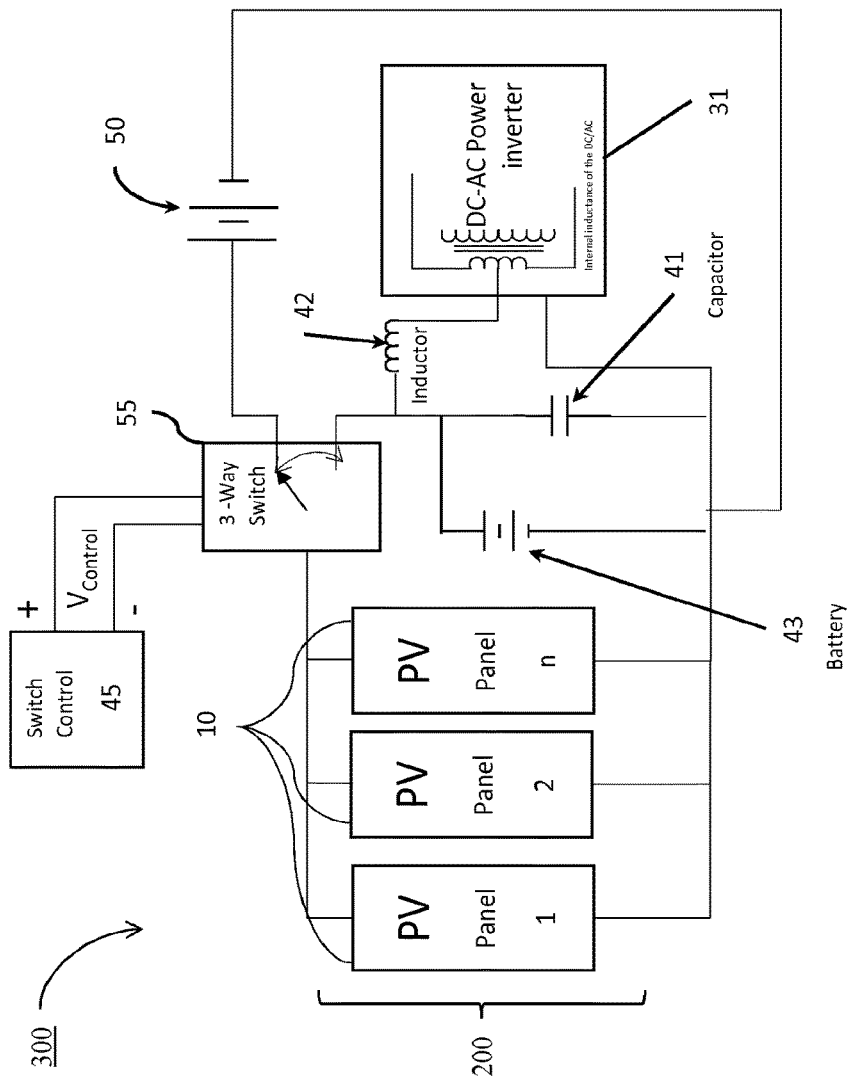
FIG. 4 is an exemplary block diagram illustrating an embodiment of the solar cell management system of FIG. 3, wherein a solar panel array is wired in parallel according to the arrangement shown in FIG. 2A and coupled to a voltage source through a switch.

The solar cell management system 300 can apply the external voltage $V_{App}$ to the photovoltaic device 200 using any suitable means described herein, including using a switch 55 as shown in FIG. 4. Turning to FIG. 4, the photovoltaic device 200 can represent any number of photovoltaic devices such as the solar cell 100 and/or the solar panels 10 as illustrated. The solar panels 10 are shown to be wired in parallel (also shown in FIG. 2A) and are connected to the switch 55, such as a single pole, double throw (or three-way) switch. However, as will be discussed with reference to FIGS. 6 and 8-12, the solar panels 10 also can be wired in series, a combination of series and parallel, and independently from one another. In one embodiment, the switch 55 is also coupled to a voltage source 50 and an external load $R_L$ (e.g., shown as the inverter 31). The inverter 31 can include both resistive and reactive components. In some embodiments, the inverter 31 can convert a DC voltage and current into an AC voltage and current, which is typically compatible in voltage and frequency with conventional AC power grids. The output frequency of the inverter 31 and the amplitude of the AC current/voltage can be based upon country, location, and local grid requirements.

The voltage source 50 can include any suitable means for maintaining a constant voltage, including ideal voltage sources, controlled voltage sources, and so on. However, in some embodiments, the voltage source 50 can have a variable, adjustable output (e.g., time varying voltage). A switch control (or controller) 45 is coupled to the switch 55 to control the duration of connection and/or the frequency of switching, such as between the voltage source 50 and the inverter 31 to the solar panels 10. The switch controller 45 can be preset to operate at a fixed switching duration D and switching frequency f. In some embodiments, the magnitude of the voltage $V_{App}$ applied by voltage source 50, the duration D of connection, and/or the frequency f of switching can be preset and/or vary based on load conditions.

For example, the switch 55 connects the solar panels 10 with the voltage source 50 in a first position (as shown with the arrow in the switch 55 of FIG. 4). When connected in the first position, the voltage source 50 applies the voltage $V_{APP}$ across the electrodes 101a, 101b (shown in FIG. 1) of the solar panels 10 and induces the electric field 250 (shown in FIG. 3) across each solar panel 10. Once the electric field 250 has been established across the solar panels 10, the switch 55 switches to connect the solar panels 10 to the inverter 31 (i.e., the load $R_L$) in a second position. Accordingly, the voltage source 50 can provide the electric field 250 without being connected to the solar panels 10 and the inverter 31 at the same time. Therefore, applying the external voltage $V_{APP}$ does not allow the load $R_L$ (e.g., the inverter 31) to draw current directly from the voltage source 50.

Application of the electric field 250 to the solar panels 10 can increase the current and power output of the solar panels 10 by a predetermined amount when the solar panels 10 subsequently are connected to the inverter 31 in the second position. The predetermined amount is dependent upon an intensity of light incident on the solar panels 10, the voltage applied $V_{APP}$ to the solar panels 10 by the voltage source 50, the thickness of the solar panels 10, the frequency f that the voltage source 50 is connected to the solar panels 10, and the duty cycle of the switching process between the first position and the second position—with the duty cycle being defined as the amount of time that the solar panels 10 are connected to the voltage source 50 divided by 1/f the switching time (i.e., multiplied by the frequency f or divided by the total period of the signal). It should be noted that the switch duration time D, the switching frequency f, and the duty cycle are all interrelated quantities such that quantifying any two of the quantities allows for determination of the third quantity. For example, specifying the switching frequency and the duty cycle allows for determination of the switch duration time D. For example, under high intensity light conditions, the improvement in power output can be on the order of 20%; under low light conditions, 50+%.

The embodiment shown in FIG. 4 advantageously provides the electric field 250 to the photovoltaic device 200 without the need to modify the solar panels 10 and/or solar cells 100 to include additional, external electrodes.

In some embodiments, an energy storage device—such as a capacitor 41, an inductor 42, and/or a battery 43—can be placed before the inverter 31 to mitigate any voltage drop-out being seen by the inverter 31 while the switch 55 is in the first position. Accordingly, while the inverter 31 (i.e., load) is disconnected from the solar panels 10 when the switch 55 is in the first position and the electric field 250 is being established across the solar panels 10, the energy storage device supplies energy to the inverter 31 to keep current flowing during this switched period. Stated in another way, the energy storage device can discharge while the solar panels 10 are disconnected from the inverter 31.

Therefore, a constant voltage from the voltage source 50—which in turn creates the electric field 250—need not be applied continuously to see an improvement in the power output of the solar panels 10. For example, with duration switching times D of nominally 10-2000 ns, $V_{App}$'s of nominally 100-500+ Volts, and a switching frequency f of 20µ seconds, the duty cycle of nominally 0.1-10% can be used. The inductor 42, the capacitor 41, and/or the battery 43 are chosen to be of sufficient size to provide enough discharge while the solar panels 10 are disconnected while the electric field 250 is being placed across the solar panels 10 so as not to cause a drop out on the output of the inverter 31.

Figure 5:
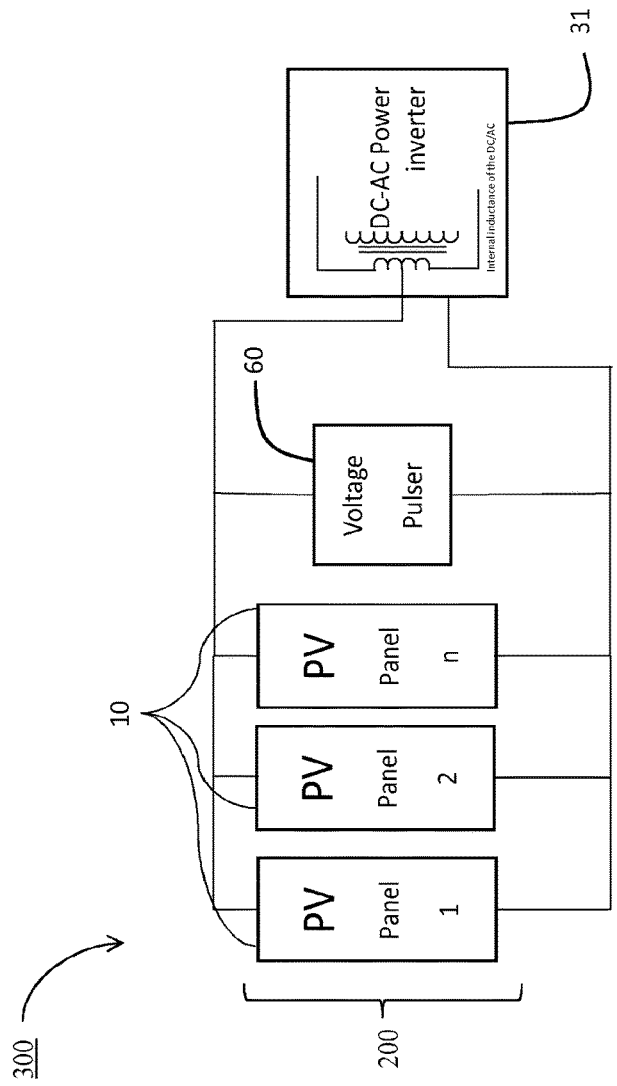
FIG. 5 is an exemplary block diagram illustrating an alternative embodiment of the solar cell management system of FIG. 3, wherein a solar panel array is wired in parallel according to the arrangement shown in FIG. 2A and coupled to a voltage pulser circuit.

FIG. 5 illustrates an alternative embodiment of the solar cell management system 300 of FIG. 3. Turning to FIG. 5, the photovoltaic device 200 can represent any number of photovoltaic devices such as the solar cell 100 and/or the solar panels 10 as illustrated. As shown, the solar panels 10 are wired in parallel (also shown in FIG. 2A), but can also be wired in series and any combination thereof as will be discussed with reference to FIGS. 13 and 15-17.

A voltage pulser 60, such as a high voltage pulse generator, can apply a time varying voltage pulse across one or more of the solar panels 10. In one embodiment, a duration $D_P$ of the voltage pulse can be short—nominally 10-2000 ns—and a magnitude can be high—nominally 100-500+ Volts. In the embodiment shown in FIG. 5, the voltages applied, the pulse width, and the pulse repetition rate are fixed at a predetermined level to provide optimum performance under selected operating conditions. For example, the voltage pulse can have the duration $D_P$ of about 1000 ns, which voltage pulse is repeated with a period of 1/f. The duration $D_P$ of the voltage pulse and the frequency f of the voltage pulse are chosen such that the reactance of inductors in the voltage inverter 31 present a high impedance to the voltage pulser 60, which high impedance allows a high voltage to be developed across the electrodes 101a, 101b (shown in FIG. 1) of the solar panels 10 and not be shorted out by the inverter 31.

Additionally, series inductors (not shown) can be placed at the input of the inverter 31, which series inductors are capable of handling the current input to the inverter 31 and act as an RF choke such that the voltage pulses are not attenuated (or effectively shorted) by the resistive component of the inverter 31. The duty cycle (time the pulse is on/time the pulse is off) can be nominally 0.1-10%.

The strength of the electric field 250 imposed on the photovoltaic device 200 is a function of the construction of the photovoltaic device 200, such as the thickness of the photovoltaic device 200, the material and dielectric constant of the photovoltaic device 200, the maximum breakdown voltage of the photovoltaic device 200, and so on.

As previously discussed, the photovoltaic device 200 can include any number of solar cells 100 and/or solar panels 10, each solar cell 100 and solar panel 10, for example, being coupled in parallel, series, and/or a combination thereof. In some embodiments, imposing the electric field 250 on a selected photovoltaic device 200 can account for the variations in configuration of the photovoltaic device 200.

Figure 6:
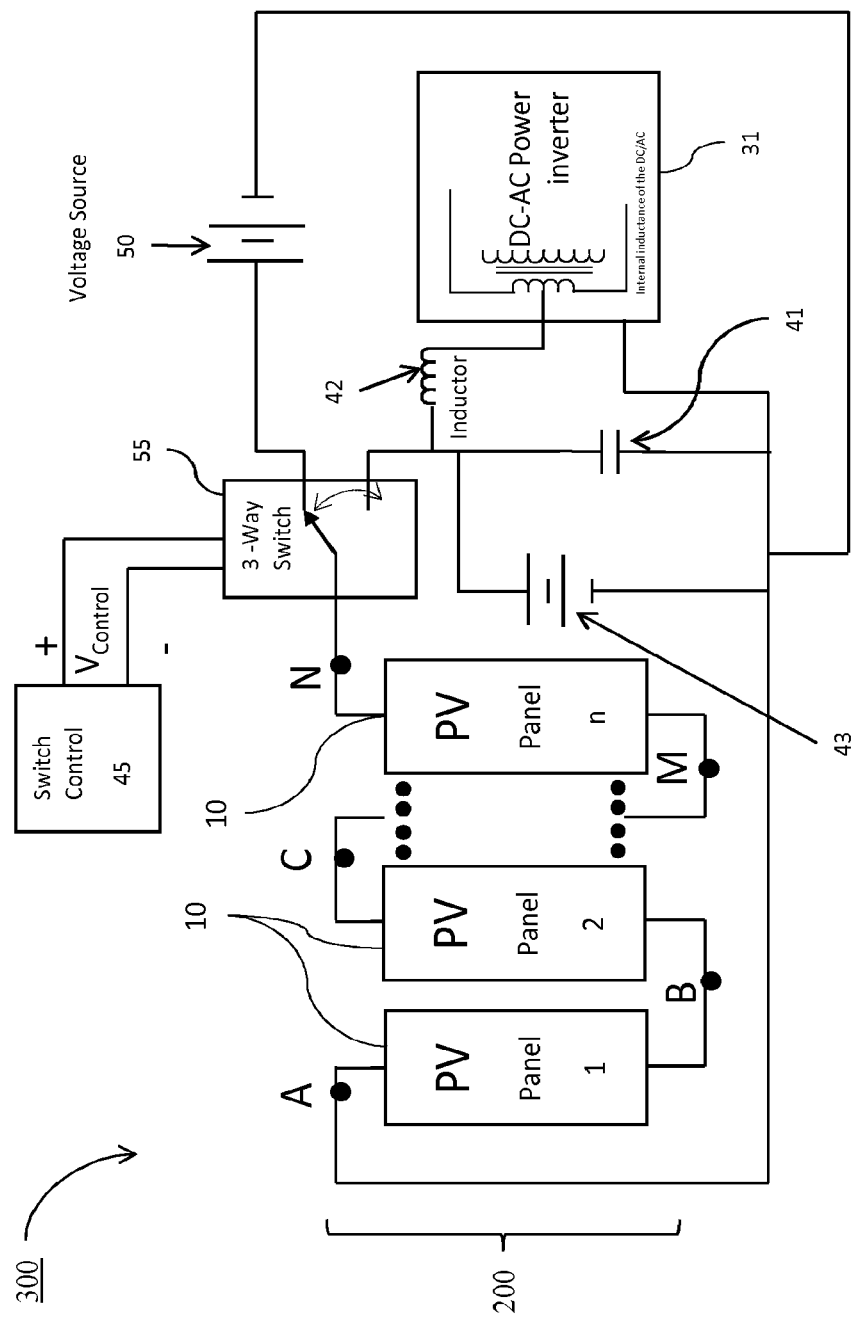
FIG. 6 is an exemplary block diagram illustrating an alternative embodiment of the solar cell management system of FIG. 4, wherein the solar panel array is coupled in series according to the arrangement shown in FIG. 2B.

For each installation option discussed with reference to FIGS. 2A-D, the solar cell management system 300 can apply the external voltage $V_{App}$ to the photovoltaic device 200. For example, using the switch 55 of FIG. 4, the solar cell management system 300 also can apply the external voltage $V_{App}$ to the solar panels 10 that are connected in series (shown in FIG. 2B) and both series and parallel (shown in FIG. 2C). Turning to FIG. 6, the solar panels 10 are wired in series and connected to the switch 55, such as the single pole, double throw (or three-way) switch of FIG. 4. In one embodiment, the switch 55 is also coupled to the voltage source 50 and the external load $R_L$ (e.g., shown as the inverter 31).

In FIG. 6, the electric field 250 (shown in FIG. 3) applied across each solar panel 10 must be greater than a predetermined minimum electric field $E_{min}$. Accordingly, the applied external voltage $V_{App}$ applied to each solar panel 10 must be greater than a predetermined minimum applied voltage $V_{min}$. In some embodiments, the external voltage $V_{App}$ applied to each solar panel 10 must also be less than a maximum applied voltage $V_{max}$ to avoid a voltage breakdown and damage to the solar panel 10 or, at least, damage to one or more solar cells 100 of the solar panels 10. Stated in another way, Equation 1 represents the upper and lower bounds of the applied external voltage $V_{App}$.

$$V_{max} > V_{APP} > V_{min} > kV_P, \quad \text{(Equation 1)}$$

In Equation 1, $V_P$ is the voltage output of the solar panel 10, and k is the kth panel in the configuration. As long as the relationship among the applied external voltage $V_{App}$ and the minimum/maximum applied voltages of Equation 1 holds true, the switch 55 can be effectively apply the electric field 250 across each solar panel 10.

Figure 7:
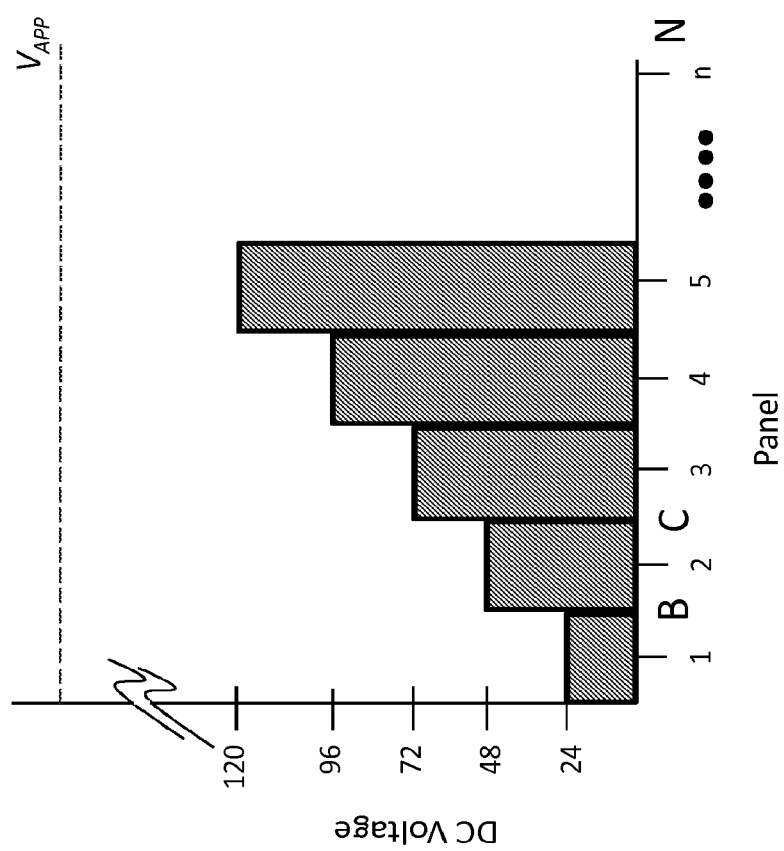
FIG. 7 is a graph illustrating an applied voltage $V_{APP}$ relative to the voltage across each solar panel of the solar cell management system of FIG. 6.
Figure 8:
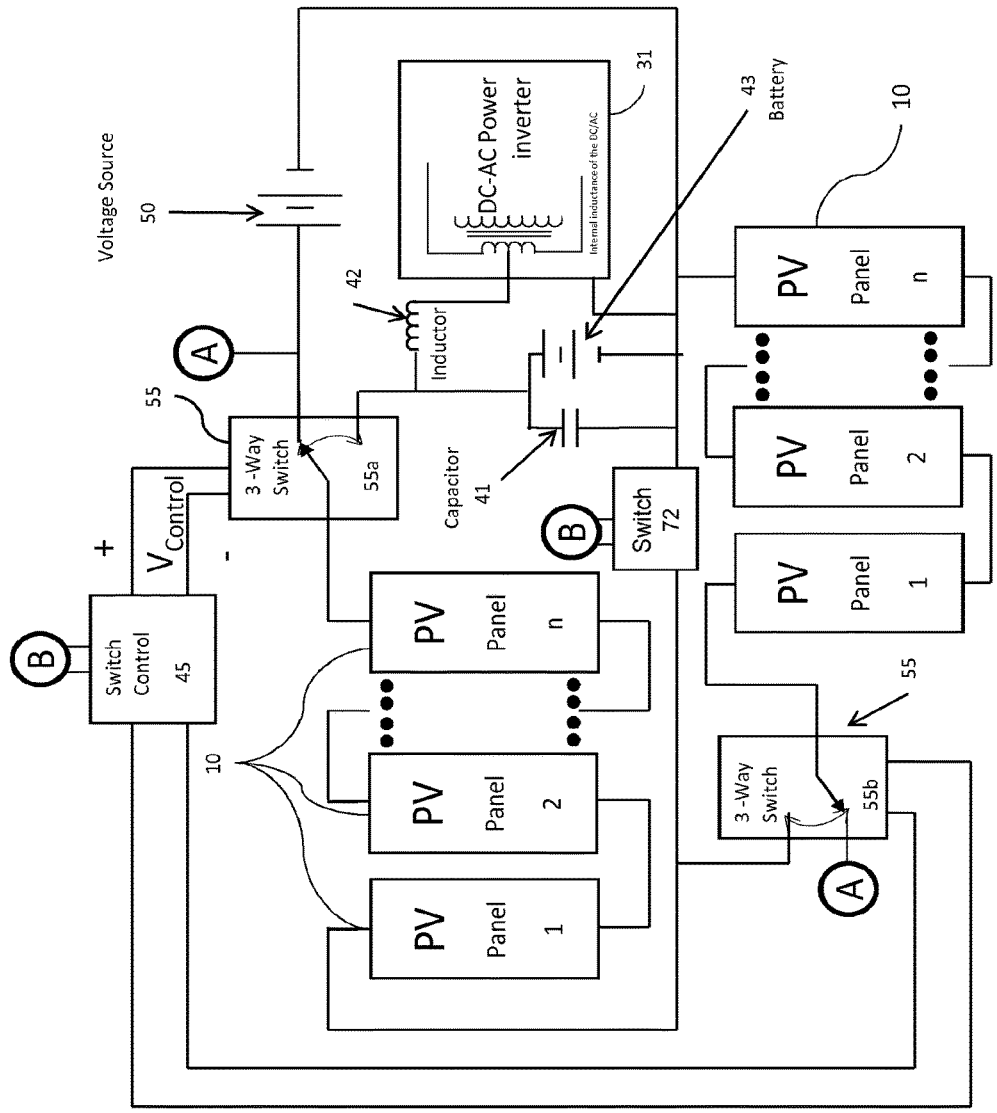
FIG. 8 is an exemplary block diagram illustrating an alternative embodiment of the solar cell management system of FIG. 6, wherein one or more of the solar panel arrays are coupled to a voltage source through one or more switches.

FIG. 7 illustrates the external voltage $V_{App}$ relative to the voltage measured across each successive solar panel 10 (e.g., from node A across nodes B, C . . . N) shown in FIG. 6 while the switch 55 is in the second position. As shown in FIG. 7, the voltage across each solar panel 10 increases by the voltage output of the solar panel 10. For example, each solar panel 10 generates a voltage of approximately twenty-four volts and that a voltage measured between the node A and any measurement node is approximately k×24 Volts, where k is the number of the solar panels 10 across which the voltage is being measured. If the inequality of the Equation 1 cannot be satisfied, the embodiment shown in FIG. 6 can be modified to include additional switches 55. For example, in one embodiment, a second switch 55 (switch 55b) can be coupled into the series of the solar panels 10 as shown in FIG. 8. However, more than one switch 55 (i.e., switch 55a, 55b . . . 55n) can be coupled to the solar panels 10 as desired.

Turning to FIG. 8, a toggle switch 72 can be added between the voltage source 50 and each group of k solar panels 10. To simplify the figures and for illustration purposes only, interconnections between different points in FIG. 8 are designated by the bordered capital letters A and B, where A couples to A and B couples to B. The toggle switch 72 can represent a single-pole, single throw (two-way) switch. Specifically, the toggle switch 72 can include N input ports and 1 output port. The toggle switch 72 further defines an ON state and an OFF state. In the ON state, all of the N input ports are simultaneously connected to the single output port. In the OFF state, none of the input ports are connected to the single output port. The toggle switch 72 can be activated by the switch controller 45, which also controls the switches 55a, 55b, and so on. As shown in FIG. 8, the toggle switch 72 provides a return electrical path for the voltage source 50 when the switches 55a, 55b are in the first position (as discussed with reference to FIG. 4). The toggle switch 72 is activated (the ON state) when the switches 55a, 55 are connected to the voltage source 50 and the electric field 250 (shown in FIG. 3) is applied to the solar panels 10. The toggle switch 72 deactivates (the OFF state) while the solar panels 10 are providing power to the inverter 31.

In a preferred embodiment, the switch control 45 can be synchronized such that switches 55a, 55b are placed in a first position simultaneously and connected to the voltage source 50, while the toggle switch 72 is concurrently activated in the ON state. Likewise, the switch controller 45 simultaneously places the switches 55a, 55b in the second position and also deactivates the toggle switch 72 (the OFF state). In some embodiments, an energy storage device—such as the capacitor 41, the inductor 42, and/or the battery 43—can be placed before the inverter 31 to mitigate any voltage drop-out being seen by the inverter 31 while the switches 55a, 55b are in the first position.

Figure 9:
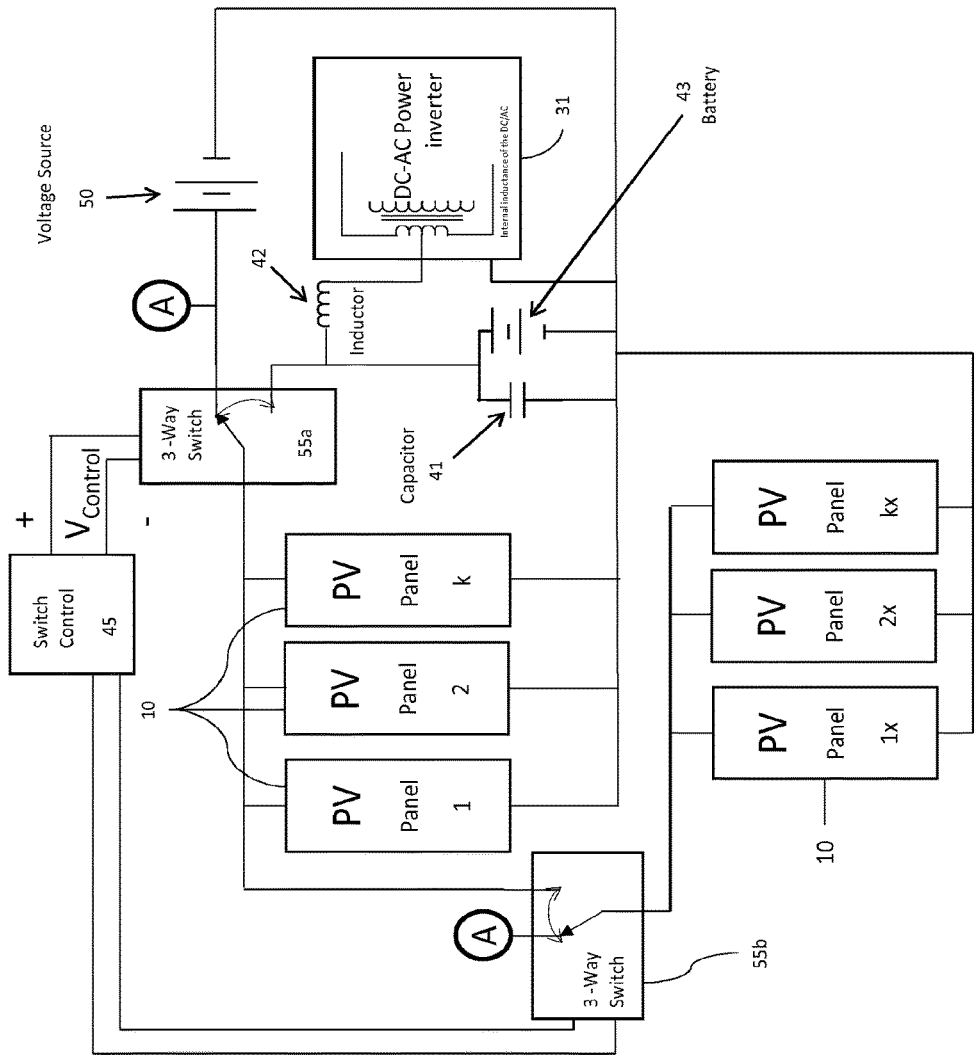
FIG. 9 is an exemplary block diagram illustrating another alternative embodiment of the solar cell management system of FIG. 4, wherein one or more of the solar panel arrays are coupled to the voltage source through one or more switches.

As discussed with reference to FIG. 4, the solar cell management system 300 also can apply the external voltage $V_{App}$ to the solar panels 10 that are connected in parallel. Turning to FIG. 9, more than one switch 55 can be controlled by the switch controller 45. In a preferred embodiment, each of the switches 55a, 55b can be synchronized by the switch controller 45 and are connected and disconnected simultaneously. As before an energy storage device—such as the capacitor 41, the inductor 42, and/or the battery 43—can be placed before the inverter 31 to mitigate any voltage drop-out being seen by the inverter 31 while the switches 55a, 55b are in the first position.

Figure 2A:
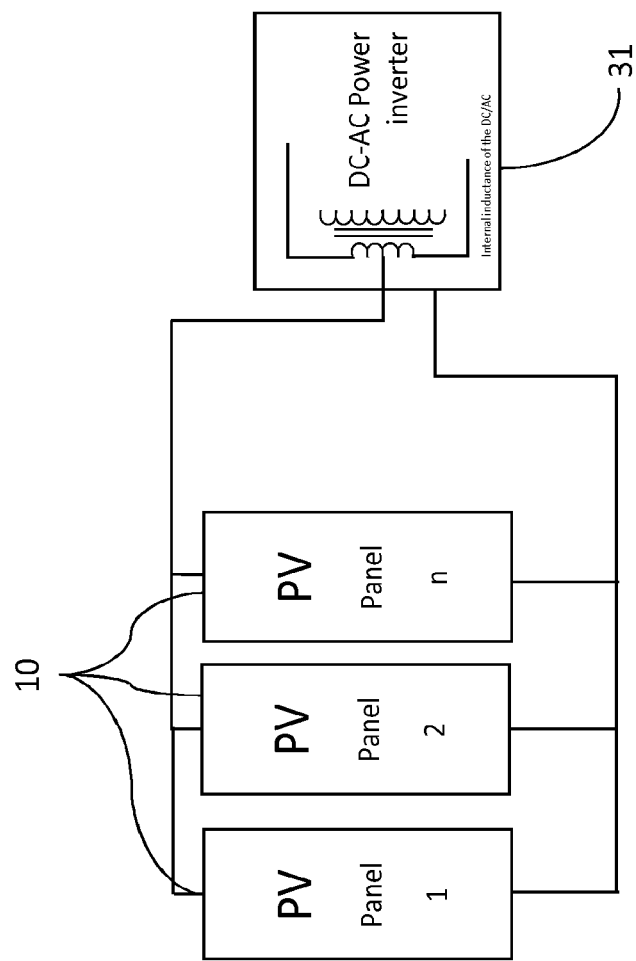
FIG. 2A is an exemplary top-level block diagram illustrating one embodiment of a solar panel array of the prior art using the solar cells of FIG. 1.
Figure 2B:
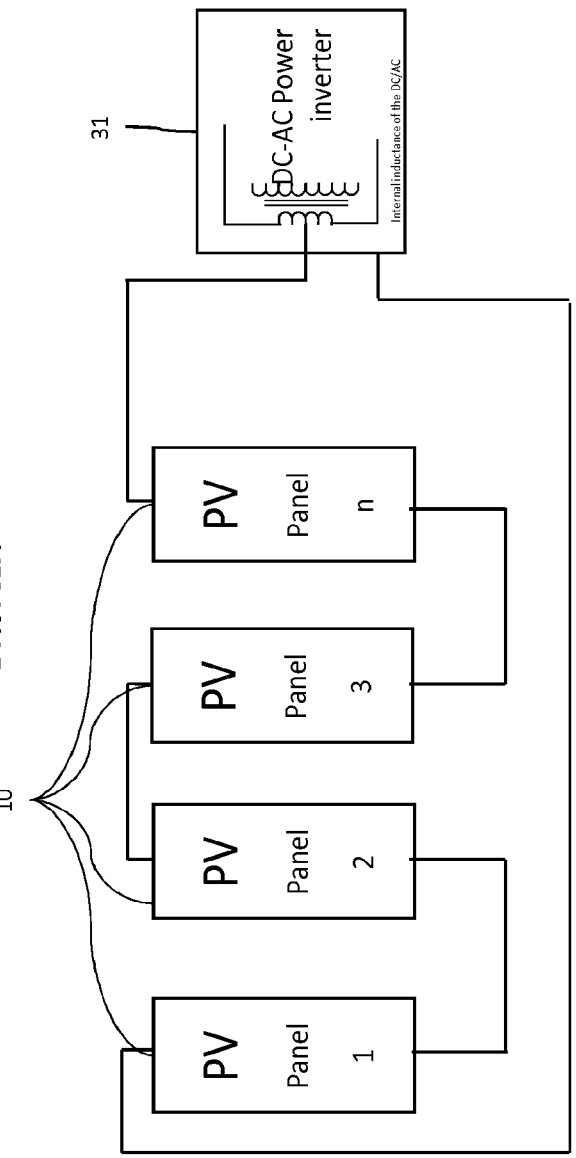
FIG. 2B is an exemplary block diagram illustrating an alternative embodiment of a solar panel array of the prior art using the solar cells of FIG. 1, wherein each solar panel is coupled in series.
Figure 2C:
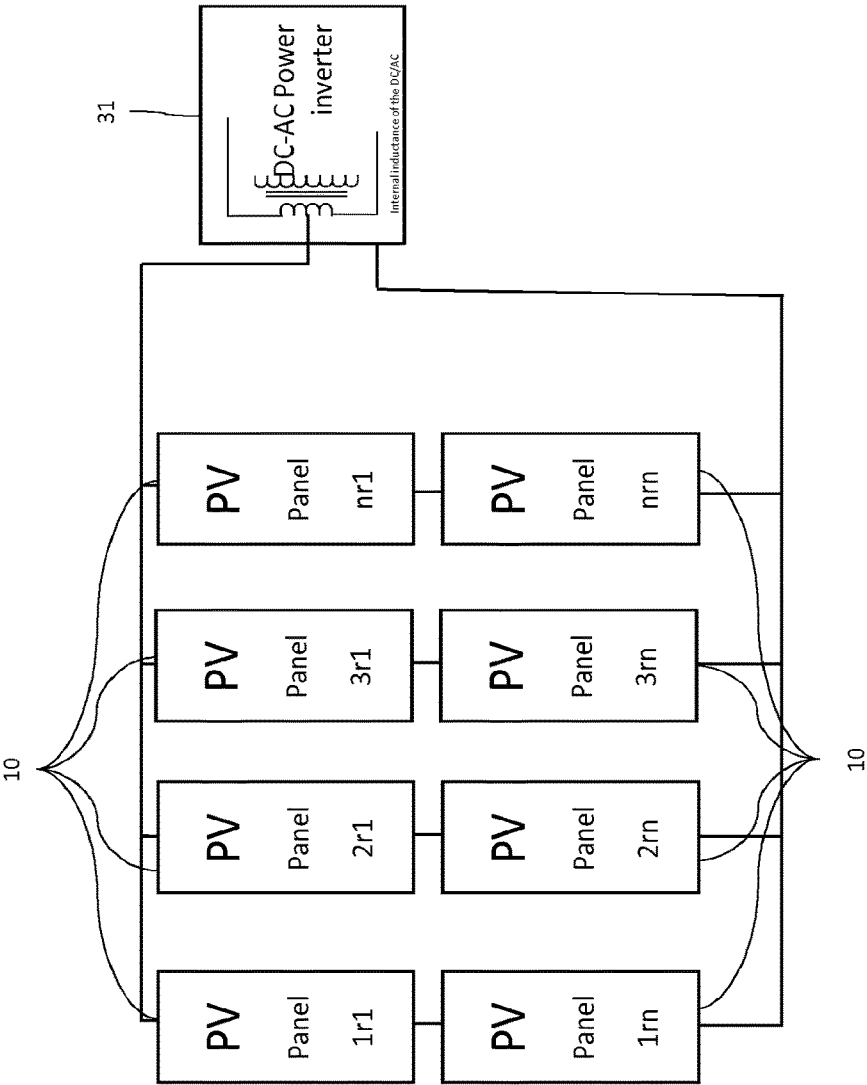
FIG. 2C is an exemplary block diagram illustrating an alternative embodiment of a solar panel array of the prior art using the solar cells of FIG. 1, wherein each solar panel is coupled both in series and in parallel.
Figure 10:
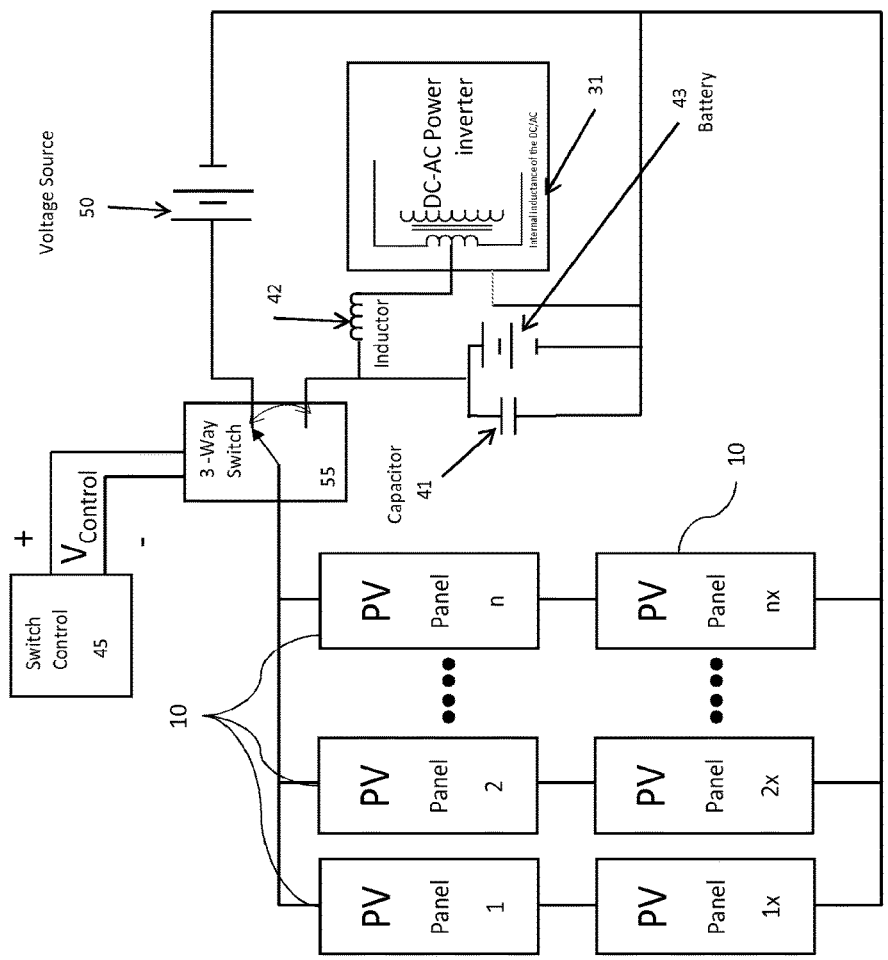
FIG. 10 is an exemplary block diagram illustrating another alternative embodiment of the solar cell management system of FIG. 4, wherein one or more of the solar panel arrays are wired both in series and parallel according to the arrangement shown in FIG. 2D and are coupled to the voltage source through a switch.

Using the switch 55 of FIG. 4, the solar cell management system 300 also can apply the external voltage $V_{App}$ to the solar panels 10 that are connected in both series and parallel (shown in FIG. 2C). Turning to FIG. 10, two or more of the solar panels 10 are shown to be wired in series. The series wired solar panels 10 are then interconnected in parallel. The number of the solar panels 10 that are wired in series and in parallel can be preselected as desired.

Figure 11:
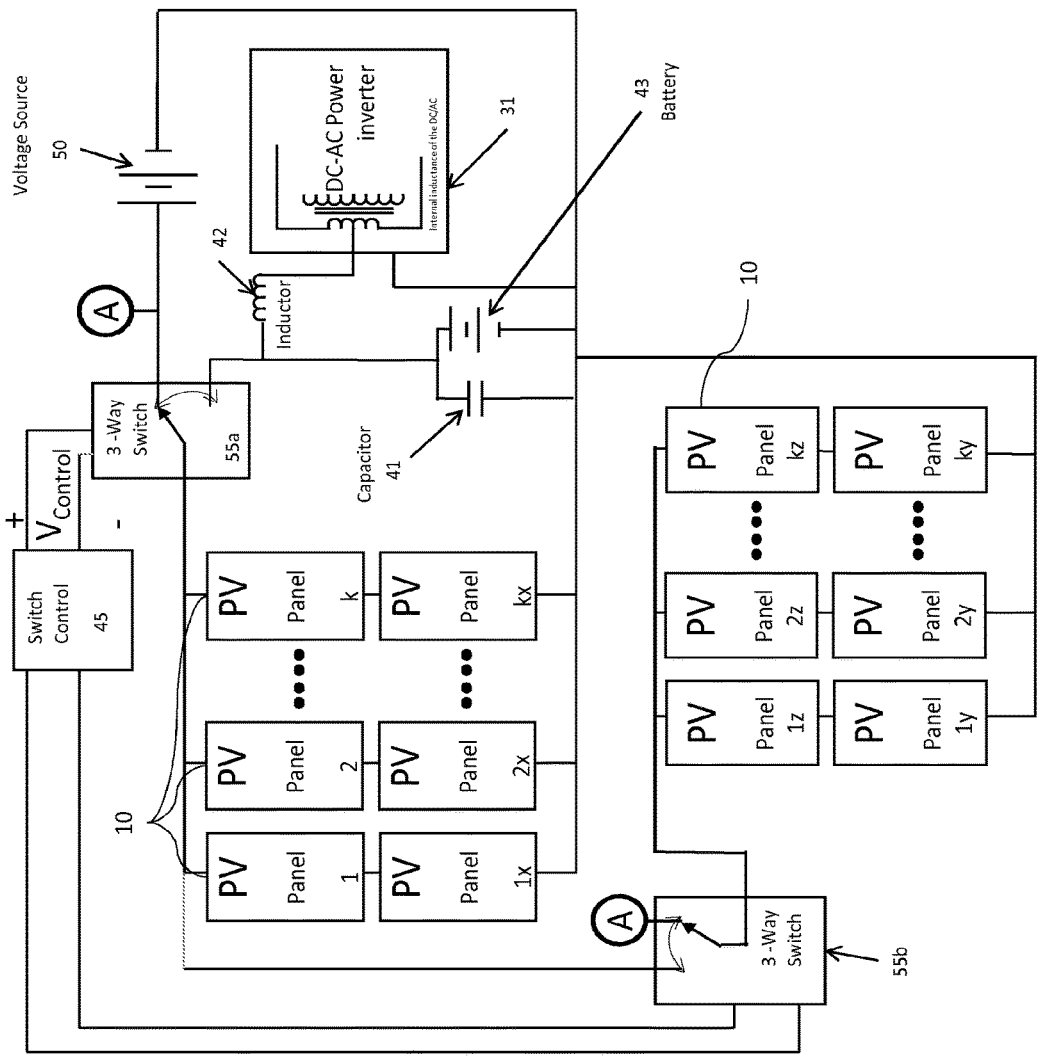
FIG. 11 is an exemplary block diagram illustrating another alternative embodiment of the solar cell management system of FIG. 10, wherein one or more of the solar panel arrays are coupled to the voltage source through one or more switches.

As shown in FIG. 10, one or more switches 55 can be used to apply the electric field 250 (shown in FIG. 3) across the solar panels 10. If more than one switch 55 is used, the solar panels 10 can be wired as shown in FIG. 11. Turning to FIG. 11, the series wired solar panels 10 are wired in parallel and then interconnected to the switches 55a, 55b. In a preferred embodiment, the switch controller 45 synchronizes the switches 55a, 55b to be disconnected from the inverter 31 simultaneously. Similarly, the switch controller 45 connects both the switches 55a, 55b to the voltage source 50 at the same time. In some embodiments, an energy storage device—such as the capacitor 41, the inductor 42, and/or the battery 43—can be placed before the inverter 31 to mitigate any voltage drop-out being seen by the inverter 31 while the switches 55a, 55b are in the first position.

Figure 2D:
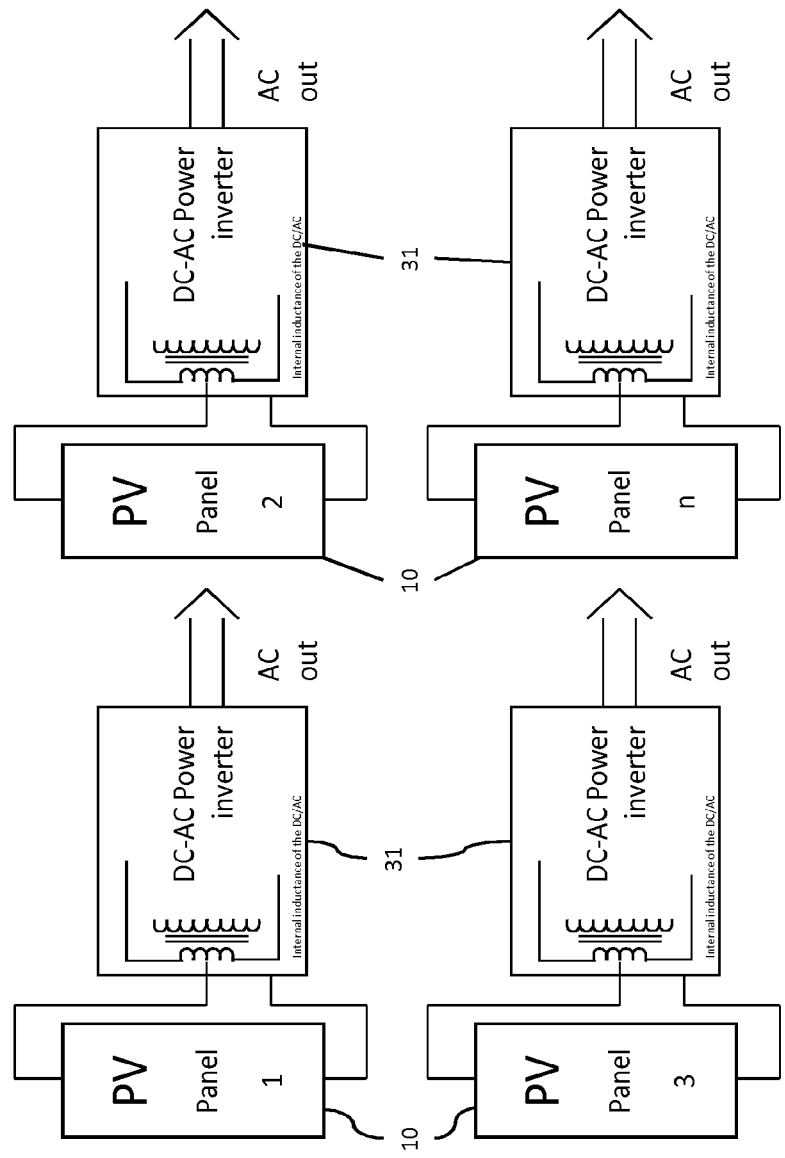
FIG. 2D is an exemplary block diagram illustrating an alternative embodiment of a solar panel array of the prior art using the solar cells of FIG. 1, wherein each solar panel is directly coupled to a load.
Figure 12A:
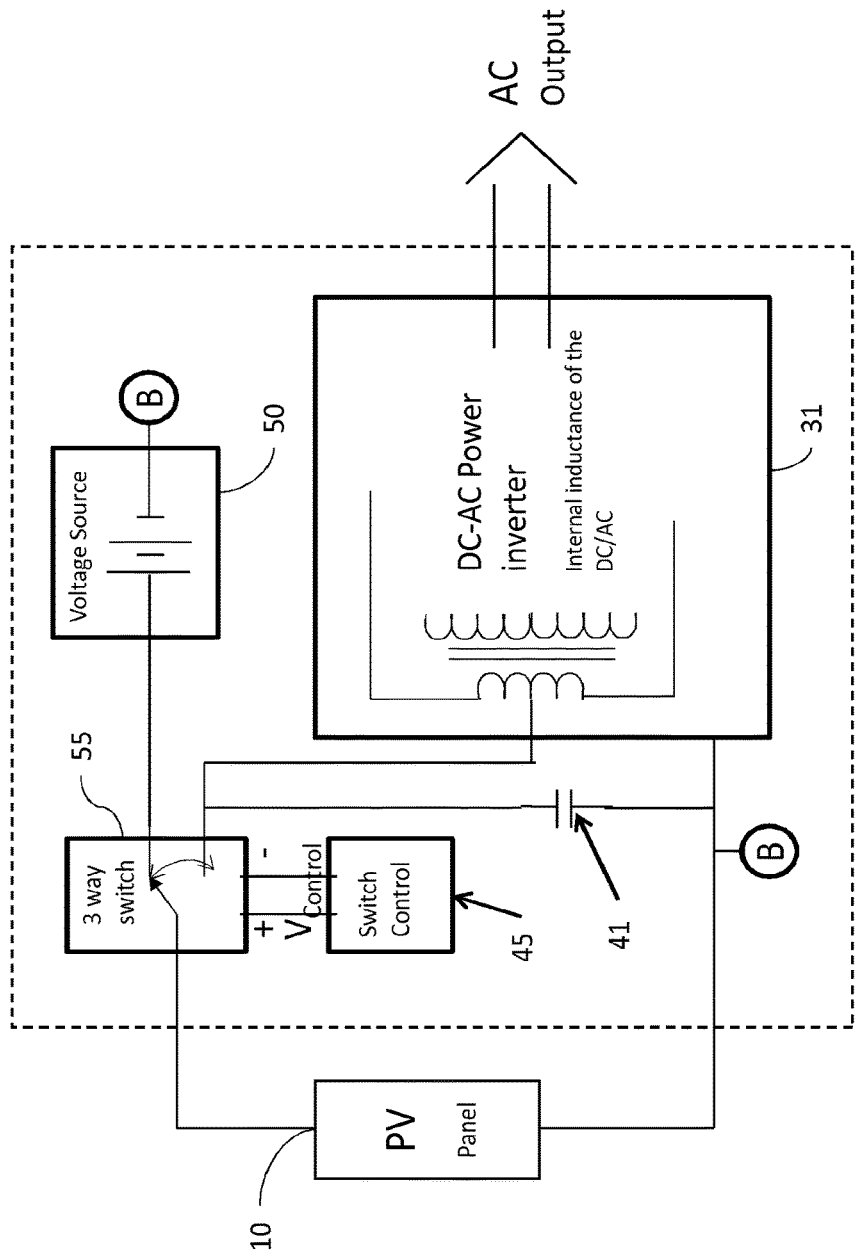
FIG. 12A-B are exemplary block diagrams illustrating alternative embodiments of the solar cell management system of FIG. 4 cooperating with the solar panel array of FIG. 2E.
Figure 12B:
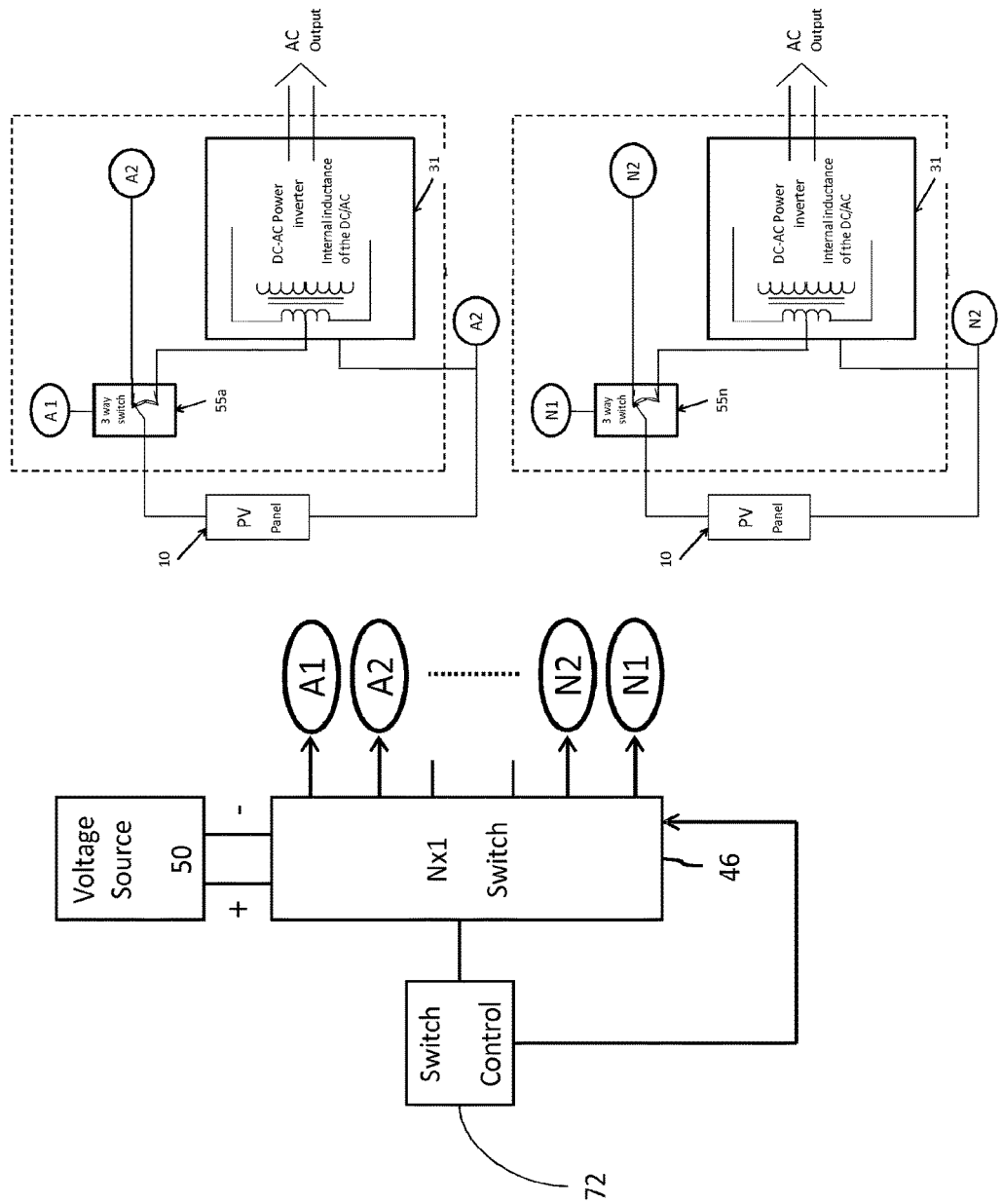

In yet another embodiment, the solar cell management system 300 can cooperate with the solar panels typically found in many residential installations—where each of the solar panels 10 are connected to its own inverter 31 (shown in FIG. 2D). Turning to FIGS. 12A-B, the switch 55 can cooperate with each solar panel 10 in a number of ways. In one embodiment, FIG. 12A illustrates the switch 55, the voltage source 50, and the switch controller 45 integrated into the inverter 31. Because the inverter 31 is typically connected to a power source, the capacitor 41 can be placed within the inverter 31. Alternatively, as shown in FIG. 2D, multiple solar panels 10 are typically used in combination and each are coupled to its own inverter 31 such that the capacitor 41 is not used. In some embodiments, each inverter 31 operates independently of all other inverters 31 such that the switch 55 is not synchronized between inverters 31. Accordingly, a momentary drop out of power on a selected solar panel does not appreciably affect the quality of power from the plurality of solar panels 10 and inverters 31.

The embodiment shown in FIG. 12A advantageously can be targeted at any new solar panel deployment. In an alternative embodiment with reference to FIG. 12B, each solar panel 10 and inverter 31 pair can include its own switch 55a-55n. Each switch 55 is connected to a central switch 46, which is controlled by a switch controller 72, and the voltage source 50.

The central switch 46 can provide two concurrent outputs to each solar panel 10, each switch 55, and each inverter 31. The first output from the central switch 46 includes A1, B1 . . . N1 and activates each switch 55 into the first position as discussed with reference to FIG. 4. The external voltage $V_{APP}$ is applied from the voltage source 50 through the second output of the central switch 46, which includes A2, B2 . . . N2.

The switch controller 72 activates a selected switch 55, one at a time, through the central switch 46 and applies the external voltage $V_{APP}$ from the voltage source 50 to each of the solar panel 10 and inverter 31 pairs, serially. Since the duty cycle of each individual switch 55 is low—typically less than 2%—the switch controller 72 controls and drives a large number of switches 55, solar panels 10, and inverters 31.

There is no limitation on this embodiment that would preclude the switch controller 72 from switching and connecting the voltage source 50 to multiple solar panels 10 as long as the voltage applied to each panel is greater than the $V_{min}$. In an alternative embodiment, more than one switch controller 72 can be added, with each switch controller 72 being responsible for a predetermined number of the solar panels 10. Each of the switch controllers 72 can behave independently.

Figure 13:
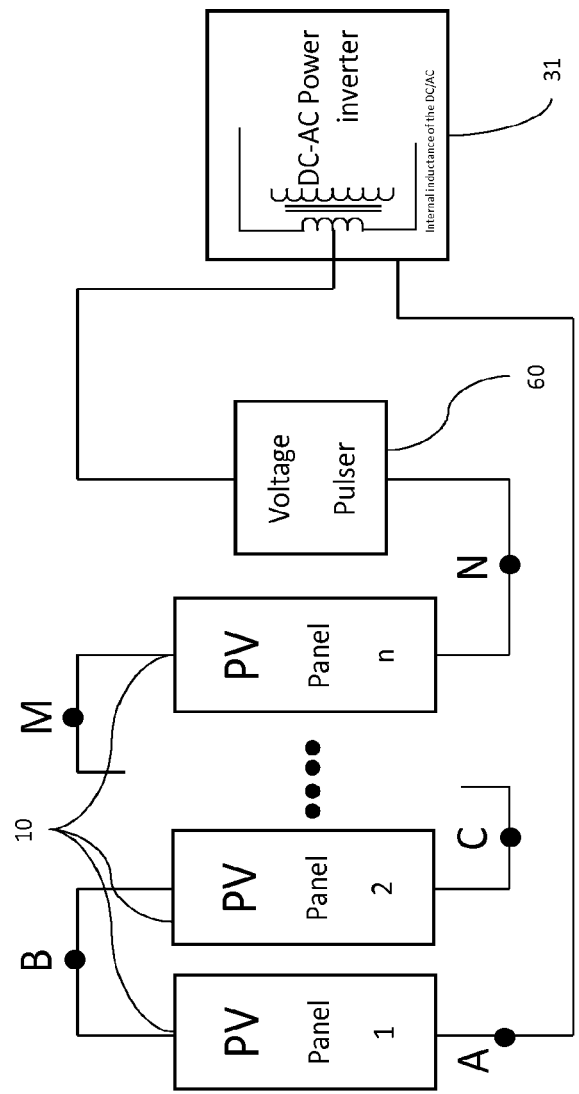
FIG. 13 is an exemplary block diagram illustrating an alternative embodiment of the solar cell management system of FIG. 5, wherein the solar panel array is wired in series according to the solar panel array of FIG. 2B.
Figure 14:
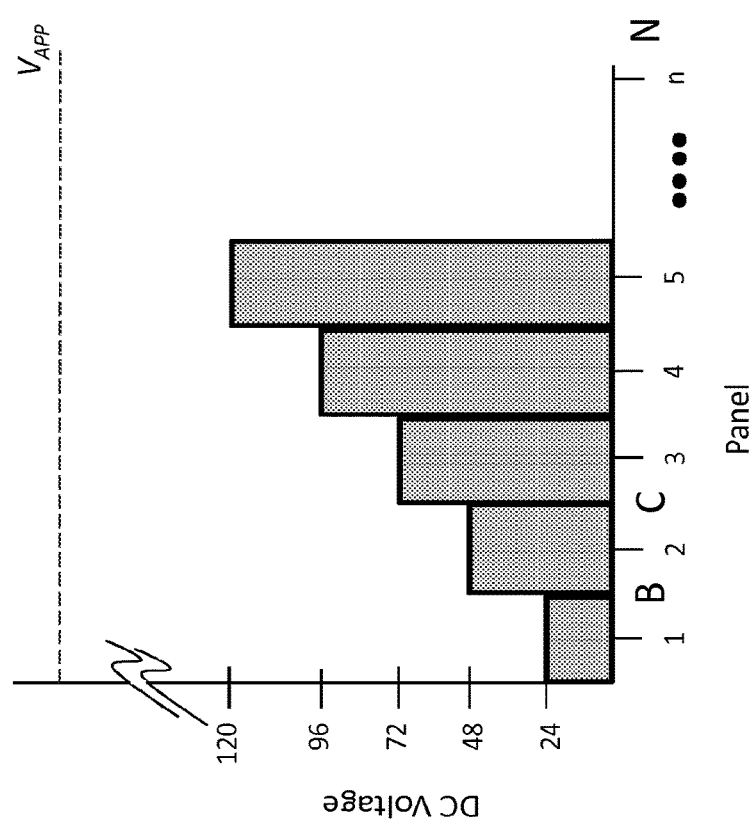
FIG. 14 is a graph illustrating an applied voltage $V_{APP}$ relative to the voltage across each solar panel of the solar cell management system of FIG. 13.

As discussed above with reference to FIG. 5, the solar cell management system 300 can also apply the external voltage $V_{App}$ to the photovoltaic device 200 using the voltage pulser 60 for a number of configurations of the solar panels 10. Turning to FIG. 13, the voltage pulser circuit 60 is connected to the solar panels 10 wired in series. As was discussed above, as long as the inequality in Equation 1 is satisfied, the voltage pulser 60 behaves as shown in FIG. 14. FIG. 14 illustrates the external voltage $V_{App}$ relative to the voltage across each successive solar panel 10 (measured across the node A to each of the solar panels 10 at the nodes B, C . . . N) in the series. As shown in FIG. 14, the voltage at each solar panel 10 increases by the voltage output of the solar panel 10. For example, each solar panel 10 generates a voltage of approximately twenty-four volts and that a voltage measured across any solar panel 10 (from the node A to the node B, C . . . N) is approximately k×24 Volts, where k is the number of solar panels 10 across which the voltage is being measured. If the inequality of the Equation 1 cannot be satisfied, the embodiment shown in FIG. 13 can be modified to include additional voltage pulsers 60.

With reference to FIG. 5, to maximize the strength of the electric field 250 across the set of solar cells 100 or the solar panels 10, the solar management system 300 considers the DC voltage being generated by each of the solar cells 100 or the solar panels 10 themselves. In one embodiment, a high voltage uplift circuit, such as an Uplift Injector Circuit 90 (shown in FIG. 18), can be used with the voltage pulser 60 to superimpose a voltage pulse on top of the DC voltage of the solar panels 10 themselves. This superposition of the voltage pulse from the voltage pulser 60 on top of the DC voltage generated by solar panels 10 can be done by creating a negative reference for the injected high voltage pulse signal that is equal to the positive DC voltage delivered by solar panels 10.

Figure 18:
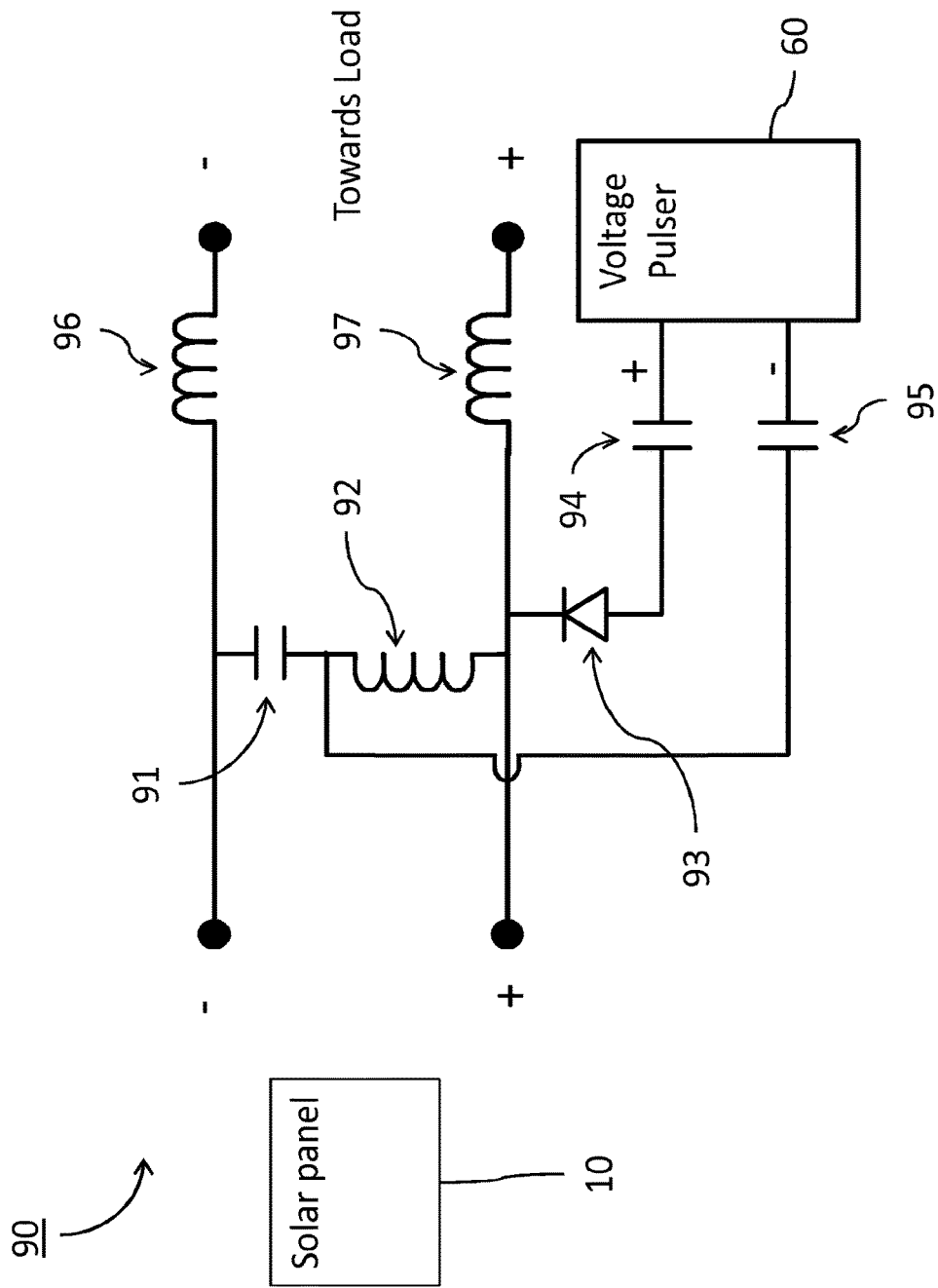
FIG. 18 is an exemplary circuit diagram illustrating an embodiment of a pulse uplift circuit for use with the solar cell management system of FIG. 5.

Turning to FIG. 18, the Uplift Injector Circuit 90 includes a capacitor 91, working in concert with an inductor 92, allows the capacitor 91 to hold a charge equal to the voltage delivered by the solar panels 10. The capacitor 91 and the inductor 92 creates an uplifted negative reference for the injected high voltage pulse signal which is connected to the voltage pulser 60 through capacitors 94 and 95. The positive reference from the voltage pulser 60 is connected through a diode 93, which provides reverse bias protection to the positive voltage line connected to the interface that connects to the solar panels 10 and the interface which is connected to the inverter 31. To provide RF isolation so that voltage pulses from the voltage pulser 60 are not shorted out by the inverter 31 and to additionally provide RF isolation between the other solar panels 10 connected between the Uplift Injector Circuit 90 and the inverter 31, inductors 96 and 97 can be placed in series between the inverter 31 and the voltage pulser 60 to provide a RF choke for any high voltage pulses. The inductors 96 and 97 attenuate any voltage pulse from the voltage pulser 60 passing across them and isolate the voltage pulser 60 from the remainder of the circuit towards the inverter 31.

As shown in FIG. 18, the inductor 92 provides high reactance protection to the injected high voltage pulse signal, keeping the signal from feeding back into the capacitor 91. The result is the injected high voltage pulse signal sitting on top of the DC voltage delivered by the solar panels 10 and rising and falling with the DC voltage, thereby maximizing the voltage pulse.

In a preferred embodiment, the Uplift Injector Circuit 90 can be incorporated as part of an interface between each voltage pulser 60 and a number of solar panels 10.

Figure 15A:
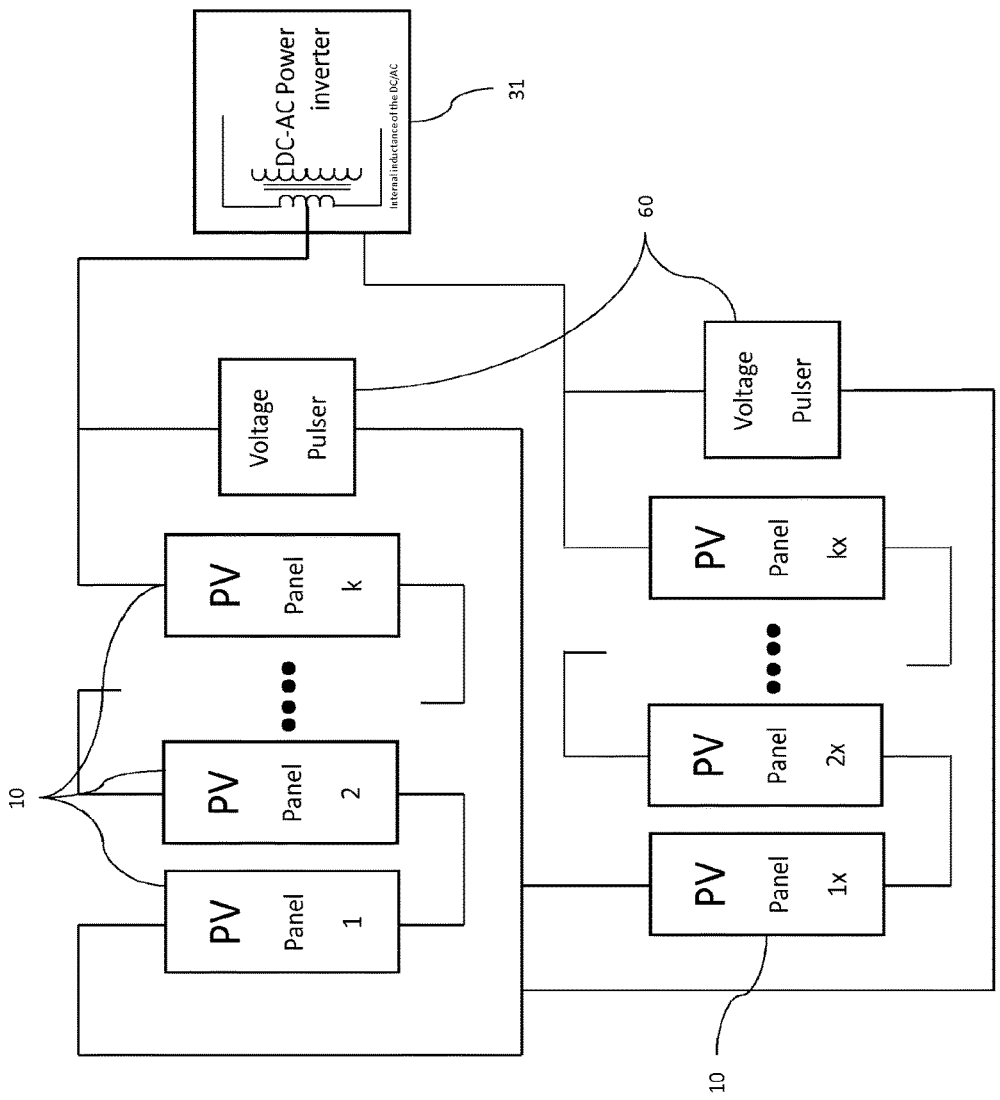
FIGS. 15A-B are exemplary block diagrams illustrating alternative embodiments of the solar cell management system of FIG. 13, wherein one or more of the solar panel arrays are coupled to one or more voltage pulsers.

In some embodiments, more than one voltage pulser 60 can be used for a predetermined number of solar panels 10 as shown in FIG. 15A. Turning to FIG. 15A, the solar panels 10 are arranged in both in series and in parallel and interconnected with the voltage pulsers 60. Each voltage pulser 60 is responsible for k panels and interconnected to the inverter 31. In some embodiments, similar to the switching system previously described in FIGS. 6 and 8-11, the use of more than one voltage pulser 60 can be synchronized. However, in the embodiment shown in FIG. 15A, the use of more than one voltage pulser 60 advantageously does not require synchronization between different voltage pulsers 60. Because the voltage pulse from each voltage pulser 60 is local to a set of the solar panels 10 that are interconnected, the application of the voltage pulse does not affect the output of the inverter 31.

Figure 15B:
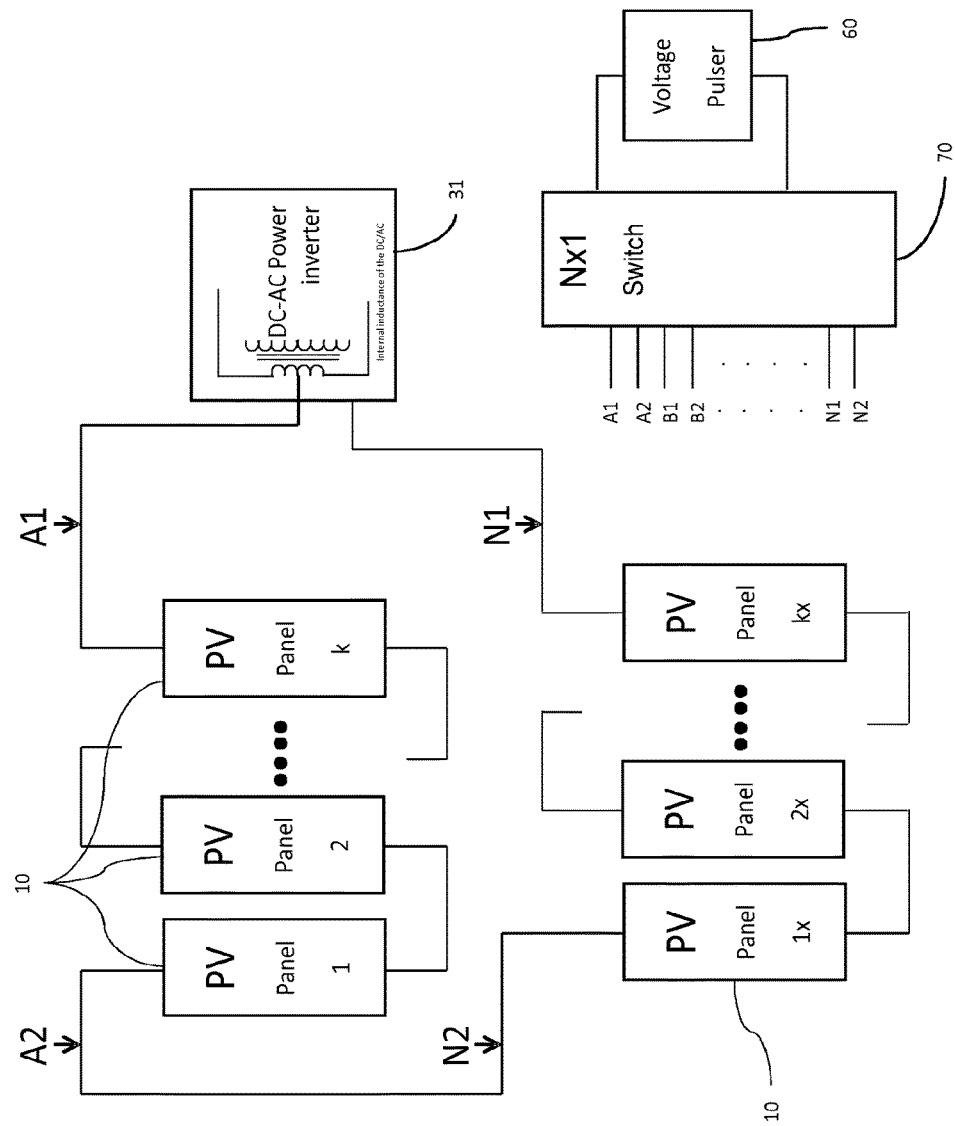

Another embodiment of implementing multiple voltage pulsers for the solar panels 10 wired in series is shown in FIG. 15B. Turning to FIG. 15B, the voltage pulser 60 is connected to each solar panel 10 via a serial switch 70. The serial switch 70 can include N output ports for coupling k solar panels 10 as shown in FIG. 15B. In the embodiment shown in FIG. 15B, to simplify the figures and for illustration purposes only, interconnections between different points in the circuit are designated by the capital letters A1 and B1 with A1 connecting to A1 and B1 connecting to B1 and so on.

The serial switch 70 includes one input port connected to the voltage pulser 60. The N output ports of the serial switch 70 connect the voltage pulser 60 across k panels 10 at a time. In one example, the serial switch 70 connects the voltage pulser 60 to the output ports A1 and A2. The voltage pulser 60 applies the external voltage $V_{App}$ across the solar panels 1 through k. The serial switch 70 disconnects the voltage pulser 60 from the outputs A1 and A2 and connects the voltage pulser 60 to outputs B1 and B2. When activated, the voltage pulser 60 applies the voltage pulse $V_{App}$ across the k panels in that leg of the solar panels 10 wired in series. In a similar manner, the serial switch 70 cycles through all ports applying the voltage pulse $V_{App}$ to k panels at a time. After all of the n solar panels 10 in series have had a voltage pulse $V_{App}$ applied, the serial switch 70 reconnects to leads A1 and A2 and the process repeats. In this manner, a single voltage pulser 60 can be utilized to apply voltage pulses $V_{App}$ to a large number of solar panels 10. Because the duty cycle of the voltage pulse is low—typically less than 2%—a single voltage pulser 60 can control multiple solar panels 10.

Figure 16:
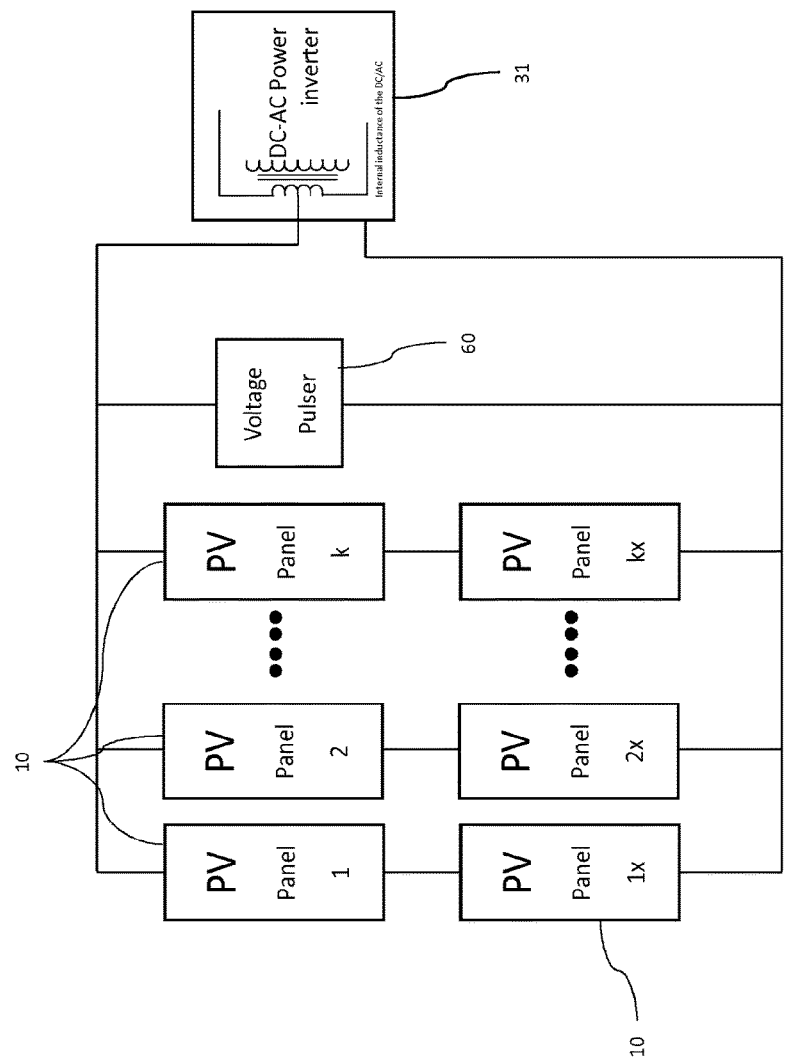
FIG. 16 is an exemplary block diagram illustrating an alternative embodiment of the solar cell management system of FIG. 5, wherein the solar panel array is wired according to the arrangement shown in FIG. 2C.

Turning to FIG. 16, the voltage pulser 60 cooperates with the solar panels 10 wired in both series and parallel in the manner discussed above with reference to FIG. 2C. The voltage pulser 60 is connected across the 2 k solar panels 10 and the inverter 31. For most situations, the magnitude of the series and shunt resistances (>>1 MΩ) found in most solar panels 10 allow the voltage pulser 60 to cooperate with a large number of solar panels 10.

Figure 17A:
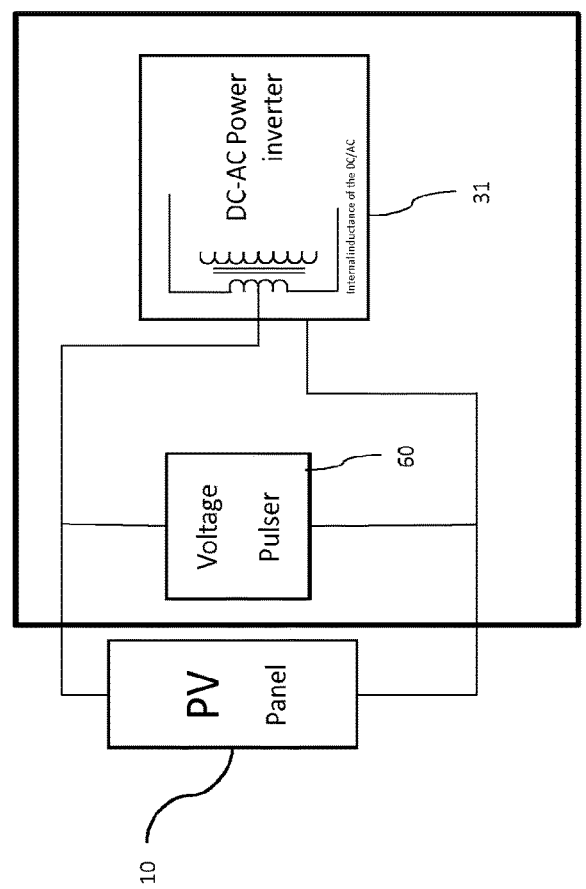
FIGS. 17A-B are exemplary block diagrams illustrating alternative embodiments of the solar cell management system of FIG. 5, wherein the solar panel array is wired according to the arrangement shown in FIG. 2D.
Figure 17B:
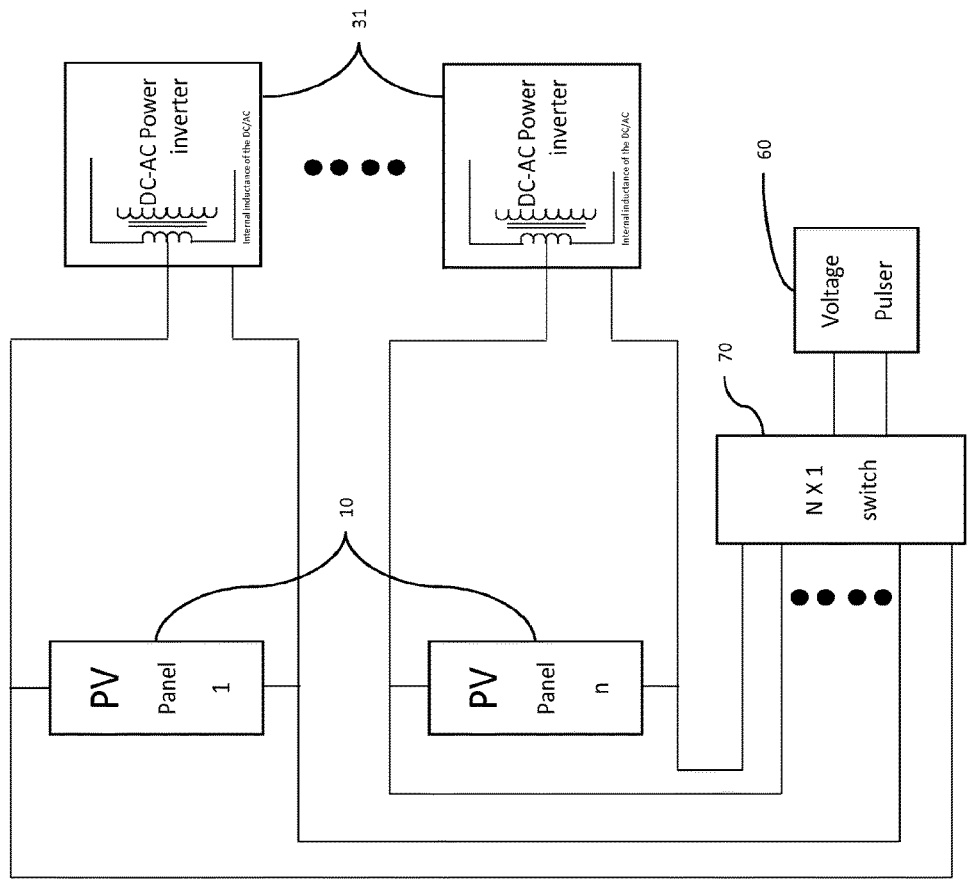

FIGS. 17A and 17B illustrates the voltage pulser 60 cooperating with the typical, residential installations of a solar panel 10. In one embodiment, turning to FIG. 17A, the voltage pulser 60 is integrated into the inverter 31 connected across solar panel 10.

FIG. 17B illustrates an alternate embodiment for cooperating with the typical, residential installations of a solar panel 10 and includes each solar panel 10 and the inverter 31 connected via the serial switch 70 to a central voltage pulser 60. The central voltage pulser 60 applies the voltage pulse $V_{App}$ through the serial switch 70 and serially to each of the solar panels 10. The serial switch 70 in FIG. 17b is shown as an Nx1 switch. The serial switch 70 has one input port, which is connected to the voltage pulser 60, and N output ports, which are connected across each individual solar panel 10 as shown in FIG. 17b. The serial switch 70 connects voltage pulser 60 across each panel 10 one at a time.

In one example, the serial switch 70 connects the voltage pulser 60 to the output ports A1 and A2. When activated, the voltage pulser 60 applies the voltage pulse $V_{App}$ across a selected solar panel 10 coupled to the serial switch 70. The serial switch 70 then disconnects the voltage pulser 60 from the output ports A1 and A2 and connects the voltage pulser 60 to the output ports B1 and B2. Again, when activated, the voltage pulser 60 applies the voltage pulse $V_{App}$ across another selected solar panel 10 coupled to the serial switch 70. In a like manner, the serial switch 70 cycles through all active ports applying a voltage pulse $V_{App}$ to a selected solar panel 10 at a time. After all of the n solar panels 10 have had a voltage pulse $V_{App}$ applied, the serial switch 70 reconnects to the output ports A1 and A2, and the process repeats. In this manner, a single voltage pulser 60 can be utilized to apply voltage pulses $V_{App}$ to a large number of solar panels 10. Since the duty cycle of the voltage pulses is very low, typically less than 2%, a single voltage pulser 60 can control a large number of the solar panels 10 and inverters 31.

There is no limitation on this embodiment that would preclude the central high voltage pulse generator from switching a voltage pulse to multiple solar panels concurrently as long as the voltage applied to each panel is greater than $V_{min}$. While the option exists to apply a high voltage pulse switch to multiple solar panels 10 concurrently, the preferred embodiment includes a single voltage pulser 60 for switching between the solar panels 10, such as in serial. In the event that the number of the solar panels 10 becomes large, additional voltage pulsers 60 and serial switches 70 can be added, with each voltage pulser 60 responsible for a number of solar panels 10.

The described embodiments are susceptible to various modifications and alternative forms, and specific examples thereof have been shown by way of example in the drawings and are herein described in detail. It should be understood, however, that the described embodiments are not to be limited to the particular forms or methods disclosed, but to the contrary, the present disclosure is to cover all modifications, equivalents, and alternatives.

What is claimed is:

1. A method of managing one or more photovoltaic devices, comprising:
    enabling a first port of a switch to be coupled to a selected photovoltaic device;
    enabling a second port of the switch to be coupled to a load driven by the selected photovoltaic device;
    enabling a third port of the switch to be coupled to a voltage source, wherein the switch can operate in a first position for providing a current path between the selected photovoltaic device and the voltage source and a second position for providing a current path between the selected photovoltaic device and the load; and
    applying a voltage signal generated by the voltage source to the selected photovoltaic device, the voltage signal having a first state including at least one voltage pulse with a positive magnitude for generating an external electric field across the selected photovoltaic device when the switch is in the first position and a second state to provide electrical isolation between the voltage source and the load when the switch is in the second position.

2. The method of claim 1, further comprising:
    enabling a first port of a second switch to be coupled to a second selected photovoltaic device;
    enabling a second port of the second switch to be coupled to the load, the load driven by the selected photovoltaic device and the second selected photovoltaic device;
    enabling a third port of the second switch to be coupled to the voltage source, wherein the second switch can operate in a first position for providing a current path between the second selected photovoltaic device and the voltage source and a second position for providing a current path between the second selected photovoltaic device and the load; and
    applying the voltage signal generated by the voltage source concurrently to both the selected photovoltaic device and the second selected photovoltaic device, the first state for generating the external electric field across both of the selected photovoltaic device and the second selected photovoltaic device when the switch and the second switch are in the first position, and the second state to provide electrical isolation between the voltage source and the load when the switch and the second switch are in the second position.

3. The method of claim 1, wherein said enabling the first port of the switch comprises enabling a first port of a double throw switch to be coupled to the selected photovoltaic device.

4. The method of claim 3, further comprising controlling at least one of a frequency and a duration of switching between the first position and the second position via a switch controller coupled to the double throw switch.

5. The method of claim 3, further comprising controlling a frequency or a duration of switching between the first position and the second position via a switch controller coupled to the double throw switch.

6. The method of claim 1, further comprising enabling a device for mitigating any voltage drop-out of the first state to be coupled between the load and the selected photovoltaic device.

7. The method of claim 1, wherein said applying the voltage signal comprises applying an adjustable voltage to the selected photovoltaic device.

8. The method of claim 1, further comprising controlling the magnitude of one or more of the at least one voltage pulse, controlling a frequency of switching between the first position and the second position, a duration of switching between the first position and the second position, a period of switching between the first position and the second position or a combination thereof.

9. The method of claim 8, further comprising measuring an output power generated by the selected photovoltaic device, an output voltage generated by the selected photovoltaic device, an output current generated by the selected photovoltaic device or a combination thereof wherein said controlling is based upon the measured output power, the measured output power, the measured output current or a combination thereof.

10. The method of claim 9, wherein said measuring the output voltage includes measuring the output voltage via a voltage probe coupled across the selected photovoltaic device, or wherein said measuring the output current includes measuring the output current via a current sensor disposed in series between the selected photovoltaic device and the load.

11. The method of claim 1, wherein said applying the voltage signal includes generating the external electric field with a predetermined field direction.

12. The method of claim 11, wherein said generating the external electric field comprises generating the external electric field with the predetermined field direction being in the same direction as a polarity of the selected photovoltaic device to increase an output power or an output current generated by the selected photovoltaic device.

13. The method of claim 11, wherein said generating the external electric field comprises generating the external electric field with the predetermined field direction being opposite a polarity of the selected photovoltaic device to decrease an output power or an output current generated by the selected photovoltaic device.

14. The method of claim 1, wherein said applying the voltage signal comprises applying the second state between adjacent first states.

15. The method of claim 1, wherein said applying the voltage signal comprises applying the voltage signal to the selected photovoltaic device being selected from among a plurality of photovoltaic devices.

16. The method of claim 15, wherein the plurality of photovoltaic devices is disposed in a series device configuration, a parallel device configuration or a combination thereof.

17. The method of claim 15, wherein said applying the voltage signal comprises applying the voltage signal to the plurality of photovoltaic devices.

18. The method of claim 17, further comprising determining the magnitude of one or more of the at least one voltage pulse based upon a device configuration of the plurality of photovoltaic devices.

19. The method of claim 17, wherein said applying the voltage signal includes generating an external electric field across the plurality of photovoltaic devices.

20. The method of claim 1, wherein said applying the voltage signal includes applying the first state as a first voltage pulse with a first positive magnitude for generating a first external electric field across the selected photovoltaic device and as a second voltage pulse with a second positive magnitude for generating a second external electric field across the selected photovoltaic device.

21. The method of claim 20, wherein said applying the first state includes applying the first voltage pulse with the first positive magnitude being equal to the second positive magnitude of the second voltage pulse.

22. The method of claim 20, wherein said applying the first state includes applying the first voltage pulse and subsequently applying the second voltage pulse.

23. The method of claim 20, wherein said applying the voltage signal includes applying the second state between the first voltage pulse and the second voltage pulse.

24. The method of claim 23, wherein said applying the second state comprises applying the second state for a predetermined time interval between the first voltage pulse and the second voltage pulse.

25. The method of claim 24, wherein said applying the second state comprises applying no voltage potential from the voltage source to the selected photovoltaic device during the predetermined time interval.

26. The method of claim 1, wherein said applying the voltage signal includes applying the first state as a series of voltage pulses with a positive magnitude and applying the second state between adjacent series of voltage pulses, each of the series of voltage pulses for generating the external electric field.

27. The method of claim 26, wherein said applying the second state comprises applying the second state between adjacent voltage pulses.

28. The method of claim 1, further comprising converting a direct current (DC) voltage or current generated by the selected photovoltaic device into an alternating current (AC) voltage or current via the load.

29. The method of claim 28, wherein the load is external to the selected photovoltaic device.

30. The method of claim 28, wherein the load comprises an inverter.

31. The method of claim 28, further comprising electrically isolating the selected photovoltaic device from the load in the radio frequency domain.

32. The method of claim 31, wherein said electrically isolating comprises electrically isolating the selected photovoltaic device from the load via at least one inductor, at least one capacitor, at least one battery or a combination thereof.

33. The method of claim 1, wherein said applying the voltage signal comprises applying the first state to the selected photovoltaic device without structural modification of the selected photovoltaic device.

34. The method of claim 33, wherein said applying the voltage signal comprises applying the first state of the voltage signal to the selected photovoltaic device via one or more existing electrodes of the selected photovoltaic device.

35. The method of claim 1, wherein said applying the voltage signal generated includes storing an output power or an output current generated by the selected photovoltaic device when the switch is in the second position.

36. The method of claim 35, further comprising driving the load via the stored output power or the stored output current when the switch is in the first position.

37. A computer program product for managing one or more photovoltaic devices, the computer program product being encoded on one or more non-transitory machine-readable storage media and comprising:
   instruction for enabling a first port of a switch to be coupled to a selected photovoltaic device;
   instruction for enabling a second port of the switch to be coupled to a load driven by the selected photovoltaic device;
   instruction for enabling a third port of the switch to be coupled to a voltage source, wherein the switch can operate in a first position for providing a current path between the selected photovoltaic device and the voltage source and a second position for providing a current path between the selected photovoltaic device and the load; and instruction for applying a voltage signal generated by the voltage source to the selected photovoltaic device, the voltage signal having a first state including at least one voltage pulse with a positive magnitude for generating an external electric field across the selected photovoltaic device when the switch is in the first position, and a second state to provide electrical isolation between the voltage source and the load when the switch is in the second position.

38. A system for managing one or more photovoltaic devices, comprising:

a voltage source for generating a voltage signal; and a first voltage switching circuit including a first port being coupled with a first photovoltaic device, a second port being coupled with a load and a third port being coupled with said voltage source, said first voltage switching circuit being adapted to transition between a first position for providing a first current path between the first photovoltaic device and said voltage source and a second position for providing a second current path between the first photovoltaic device and the load;

wherein said voltage source applies the voltage signal to the first photovoltaic device via said first voltage switching circuit, the voltage signal having a first state including at least one voltage pulse with a positive magnitude for generating an external electric field across the first photovoltaic device when said first voltage switching circuit is in the first position and a second state to provide electrical isolation between said voltage source and the load when said first voltage switching circuit is in the second position.

39. The system of claim 38, further comprising a second voltage switching circuit including a first port being coupled with a second photovoltaic device, a second port being coupled with the load and a third port being coupled with said voltage source, said second voltage switching circuit being adapted to transition between a first position for providing a first current path between the second photovoltaic device and said voltage source and a second position for providing a second current path between the second photovoltaic device and the load, wherein said voltage source applies the voltage signal concurrently to the first and second photovoltaic devices, the first state for generating the external electric field across both of the first photovoltaic device and the second selected photovoltaic device when the first voltage switching circuit and second voltage switching circuit are in the respective first positions and the second state to provide electrical isolation between said voltage source and the load when the first voltage switching circuit and second voltage switching circuit are in the respective second positions.

40. The system of claim 38, wherein said first voltage switching circuit comprises a double throw switch.

41. The system of claim 38, further comprising a device for mitigating any voltage drop-out of the first state and being coupled between the load and the first photovoltaic device.

42. The system of claim 38, wherein said voltage source applies an adjustable voltage to the first photovoltaic device.

43. The system of claim 38, further comprising a switch controller for controlling the magnitude of one or more of the at least one voltage pulse, controlling a frequency of switching between the first position and the second position, a duration of switching between the first position and the second position, a period of switching between the first position and the second position or a combination thereof.

44. The system of claim 43, further comprising a measuring system for measuring an output power generated by the first photovoltaic device, an output voltage generated by the first photovoltaic device, an output current generated by the first photovoltaic device or a combination thereof, wherein said switch controller controls the magnitude, the frequency of switching, the duration of switching, the period of switching or a combination thereof based upon the measured output power, the measured output power, the measured output current or a combination thereof.

45. The system of claim 44, wherein said measuring system includes a voltage probe coupled across the first photovoltaic device for measuring the output voltage, a current sensor disposed in series between the first photovoltaic device and the load for measuring the output current or a combination thereof.

46. The system of claim 38, wherein said voltage source applies the voltage signal to generate the external electric field with a predetermined field direction.

47. The system of claim 46, wherein the predetermined field direction is in the same direction as a polarity of the first photovoltaic device to increase an output power or an output current generated by the first photovoltaic device.

48. The system of claim 46, wherein the predetermined field direction is opposite a polarity of the first photovoltaic device to decrease an output power or an output current generated by the first photovoltaic device.

49. The system of claim 38, wherein said voltage source applies the second state between adjacent first states.

50. The system of claim 38, wherein the first photovoltaic device is selected from among a plurality of photovoltaic devices.

51. The system of claim 50, wherein the plurality of photovoltaic devices is disposed in a series device configuration, a parallel device configuration or a combination thereof.

52. The system of claim 50, wherein said voltage source applies the voltage signal to the plurality of photovoltaic devices.

53. The system of claim 52, wherein said voltage source determines the magnitude of one or more of the at least one voltage pulse based upon a device configuration of the plurality of photovoltaic devices.

54. The system of claim 52, wherein the voltage signal generates an external electric field across the plurality of photovoltaic devices.

55. The system of claim 38, wherein said voltage source applies the first state as a first voltage pulse with a first positive magnitude for generating a first external electric field across the first photovoltaic device and as a second voltage pulse with a second positive magnitude for generating a second external electric field across the first photovoltaic device.

56. The system of claim 55, wherein the first positive magnitude of the first voltage pulse is equal to the second positive magnitude of the second voltage pulse.

57. The system of claim 55, wherein said voltage source applies the first state and subsequently applies the second voltage pulse.

58. The system of claim 55, wherein said voltage source applies the second state between the first voltage pulse and the second voltage pulse.

59. The system of claim 58, wherein said voltage source applies the second state for a predetermined time interval between the first voltage pulse and the second voltage pulse.

60. The system of claim 59, wherein said voltage source applies no voltage potential to the first photovoltaic device during the predetermined time interval.

61. The system of claim 38, wherein said voltage source applies the first state as a series of voltage pulses with a positive magnitude and applies the second state between adjacent series of voltage pulses, each of the series of voltage pulses for generating the external electric field.

62. The system of claim 61, wherein said voltage source applies the second state between adjacent voltage pulses.

63. The system of claim 38, wherein the load converts a direct current (DC) voltage or current generated by the first photovoltaic device into an alternating current (AC) voltage or current.

64. The system of claim 63, wherein the load is external to the first photovoltaic device.

65. The system of claim 63, wherein the load comprises an inverter.

66. The system of claim 63, wherein the first photovoltaic device is electrically isolated from the load in the radio frequency domain.

67. The system of claim 66, wherein the first photovoltaic device is electrically isolated from the load via at least one inductor, at least one capacitor, at least one battery or a combination thereof.

68. The system of claim 38, wherein the first photovoltaic device includes no structural modification.

69. The system of claim 68, wherein said voltage source applies the voltage signal via one or more existing electrodes of the first photovoltaic device.

70. The system of claim 38, further comprising an energy storing device for storing an output power or an output current generated by the first photovoltaic device when first voltage switching circuit is in the second position.

71. The system of claim 70, wherein said energy storing device drives the load via the stored output power or the stored output current when the first voltage switching circuit is in the first position.

72. A method of managing one or more photovoltaic devices, comprising:
coupling a first port of a switch to a selected photovoltaic device;
coupling a second port of the switch to a load driven by the selected photovoltaic device;
coupling a third port of the switch a voltage source, wherein the switch can operate in a first position for providing a first current path between the selected photovoltaic device and the voltage source and a second position for providing a second current path between the selected photovoltaic device and the load; and
applying a voltage signal generated by the voltage source to the selected photovoltaic device, the voltage signal having a first state including at least one voltage pulse with a positive magnitude for generating an external electric field across the selected photovoltaic device when the switch is in the first position and a second state to provide electrical isolation between the voltage source and the load when the switch is in the second position.

73. The method of claim 72, further comprising:
coupling a first port of a second switch to a second selected photovoltaic device;
coupling a second port of the second switch to the load, the load driven by the selected photovoltaic device and the second selected photovoltaic device;
coupling a third port of the second switch to the voltage source, wherein the second switch can operate in a first position for providing a first current path between the second selected photovoltaic device and the voltage source and a second position for providing a second current path between the second selected photovoltaic device and the load; and
applying the voltage signal generated by the voltage source concurrently to both the selected photovoltaic device and the second selected photovoltaic device, the first state for generating the external electric field across both of the selected photovoltaic device and the second selected photovoltaic device when the switch and the second switch are in the first position, and the second state to provide electrical isolation between the voltage source and the load when the switch and the second switch are in the second position.

* * * * *